(12) United States Patent
Yokoyama et al.

(10) Patent No.: US 8,457,272 B2
(45) Date of Patent: Jun. 4, 2013

(54) SHIFT REGISTER

(75) Inventors: Makoto Yokoyama, Osaka (JP); Shige Furuta, Osaka (JP); Yuhichiroh Murakami, Osaka (JP); Yasushi Sasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 294 days.

(21) Appl. No.: 12/734,218

(22) PCT Filed: Aug. 26, 2008

(86) PCT No.: PCT/JP2008/065176
§ 371 (c)(1),
(2), (4) Date: Apr. 19, 2010

(87) PCT Pub. No.: WO2009/084271
PCT Pub. Date: Jul. 9, 2009

(65) Prior Publication Data
US 2010/0214206 A1    Aug. 26, 2010

(30) Foreign Application Priority Data
Dec. 27, 2007 (JP) .................................. 2007-336237

(51) Int. Cl.
*G11C 19/00* (2006.01)
(52) U.S. Cl.
USPC .................... 377/64; 377/68; 377/78; 377/79
(58) Field of Classification Search
None
See application file for complete search history.

(56) References Cited

U.S. PATENT DOCUMENTS

| | | | | |
|---|---|---|---|---|
| 3,636,376 | A | * | 1/1972 | Hoffmann ........................ 377/78 |
| 4,630,295 | A | * | 12/1986 | Kamuro et al. ................. 377/81 |
| 5,218,974 | A | * | 6/1993 | Garrett .......................... 128/845 |
| 5,289,518 | A | * | 2/1994 | Nakao ............................. 377/81 |
| 6,204,707 | B1 | * | 3/2001 | Hamada et al. ............... 327/202 |
| 6,630,853 | B1 | * | 10/2003 | Hamada ........................ 327/202 |
| 7,420,391 | B2 | * | 9/2008 | Pesci ............................... 326/46 |
| 7,430,268 | B2 | * | 9/2008 | Yu .................................. 377/64 |
| 7,612,754 | B2 | * | 11/2009 | Kuo et al. ..................... 345/100 |
| 7,664,218 | B2 | | 2/2010 | Tobita |
| 2002/0149318 | A1 | | 10/2002 | Jeon |
| 2007/0248205 | A1 | | 10/2007 | Deane |
| 2008/0101529 | A1 | | 5/2008 | Tobita |
| 2008/0253500 | A1 | * | 10/2008 | Tso et al. ........................ 377/69 |

FOREIGN PATENT DOCUMENTS

| | | |
|---|---|---|
| JP | 04-030398 | 2/1992 |
| JP | 04-145721 | 5/1992 |

(Continued)

*Primary Examiner* — Tuan T Lam
(74) *Attorney, Agent, or Firm* — Harness, Dickey & Pierce, P.L.C.

(57) ABSTRACT

At least one embodiment the present invention a plurality of unit circuits connected in multiple stages, to normal operation when the unit circuits are simultaneously turned on to output high-level output signals. When a shift register malfunctions, so that output signals provided by previous- and subsequent-stage unit circuits are simultaneously set to high level, malfunction restoration circuits and included in a unit circuit detect the malfunction in at least one embodiment. The malfunction restoration circuit provides a high voltage to a node, thereby forcibly pulling down an output signal. Also, the malfunction restoration circuit forcibly discharges another node, so that a charge accumulated in a capacitance is released. As a result, the shift register in malfunction can be instantaneously restored to normal operation. At least one embodiment of the present invention is suitable for driver circuits or suchlike of display devices and imaging devices.

6 Claims, 17 Drawing Sheets

FOREIGN PATENT DOCUMENTS

| | | |
|---|---|---|
| JP | 2001-273785 | 10/2001 |
| JP | 2002-258819 | 9/2002 |
| JP | 2008-108374 | 5/2008 |
| WO | WO 2006/013542 | 2/2006 |

* cited by examiner

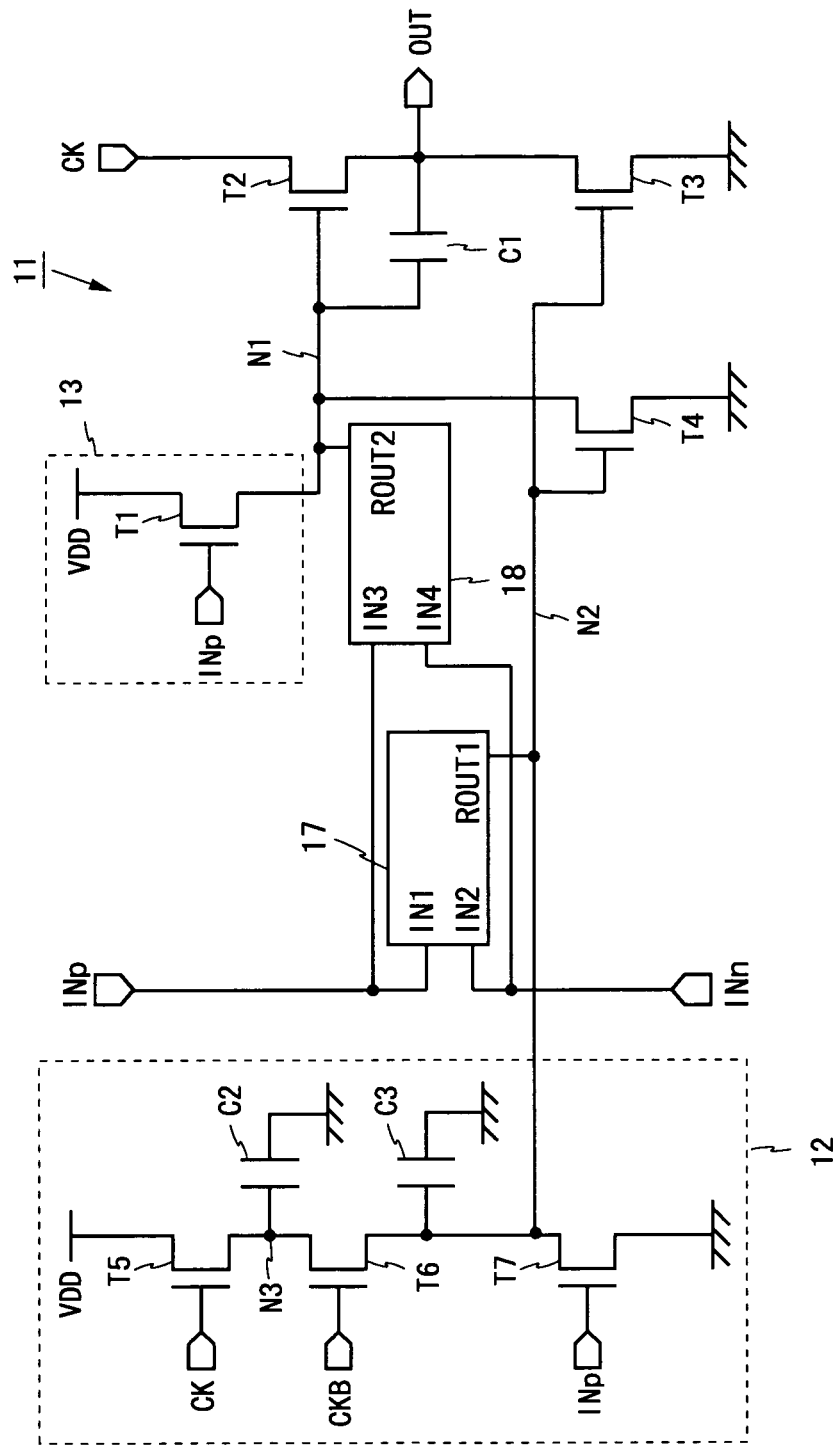
F I G. 2

FIG. 3
(A)
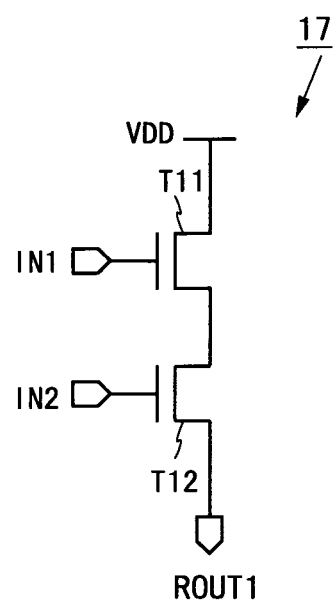
(B)
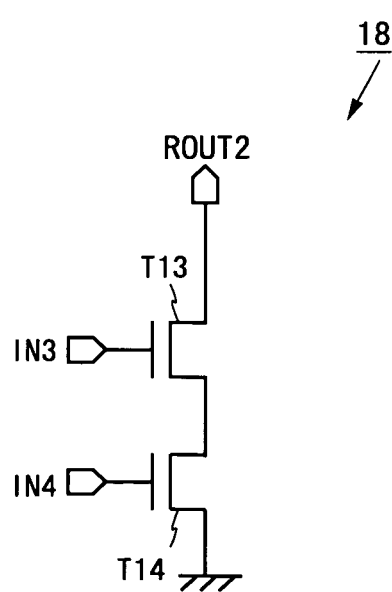

F I G. 1 0
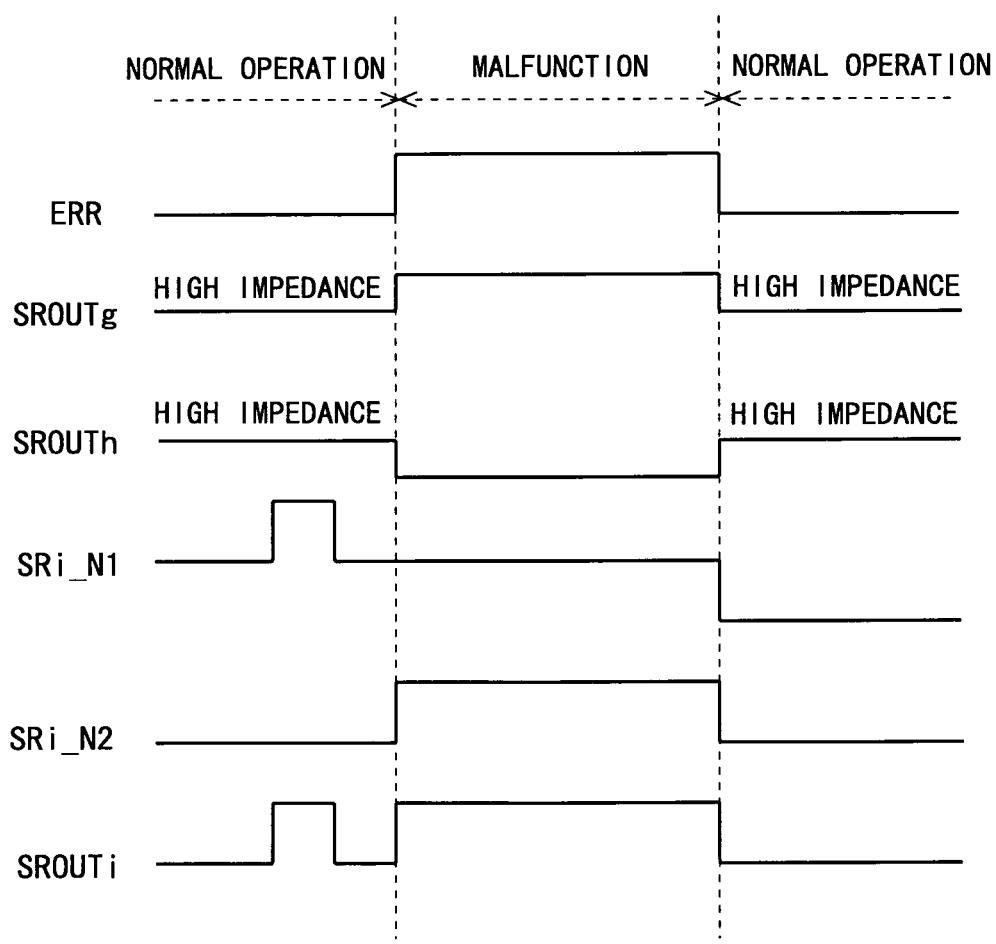

FIG. 11
(A)
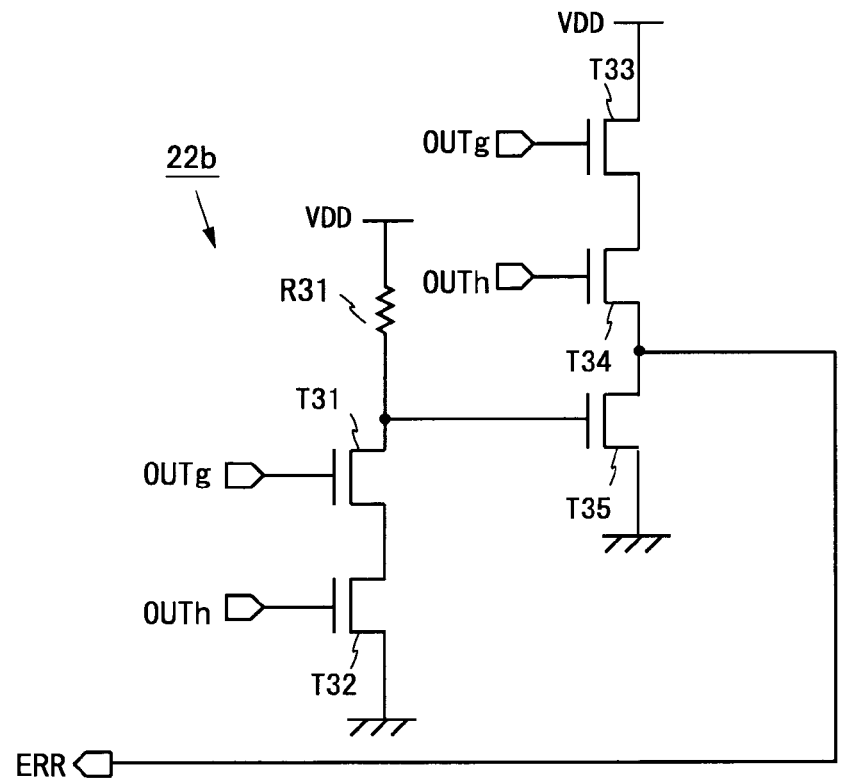
(B)
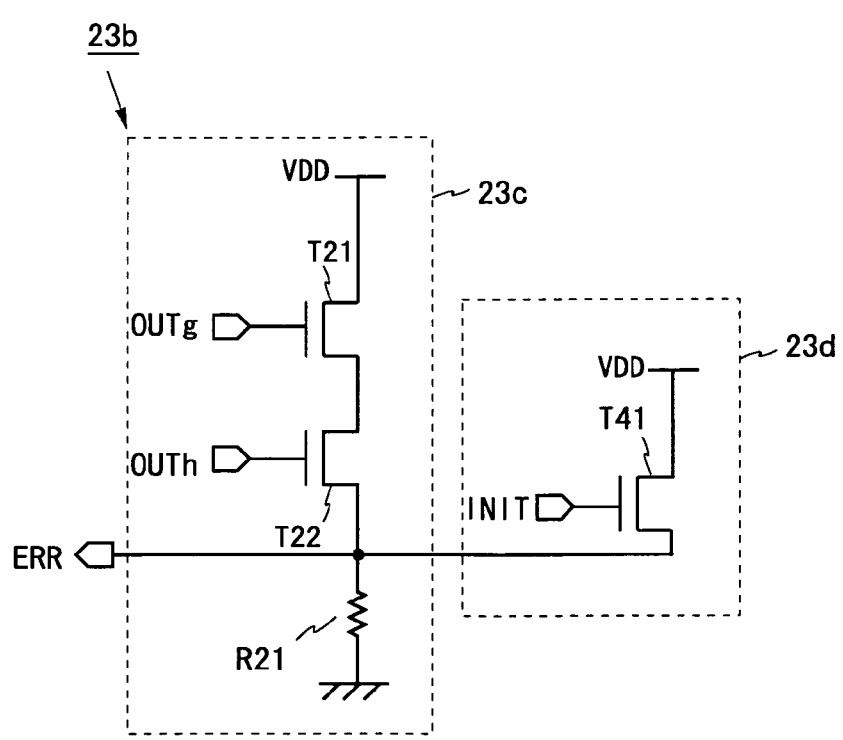

FIG. 12
(A)
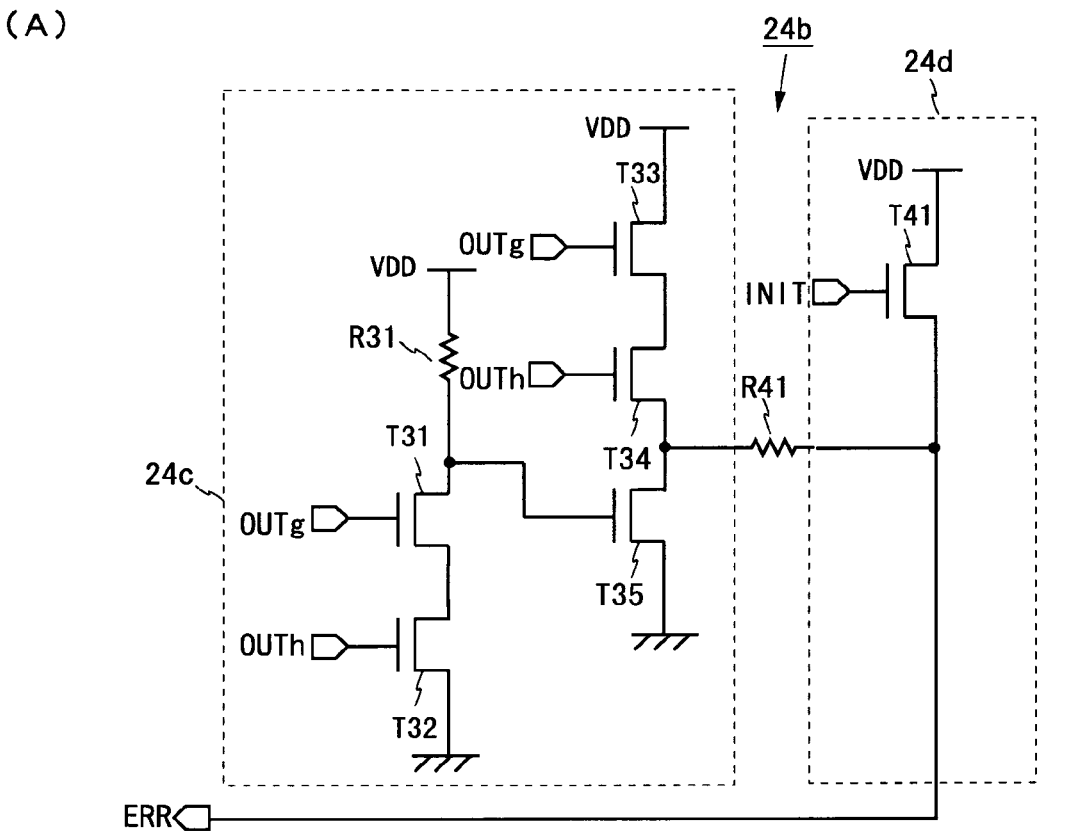
(B)
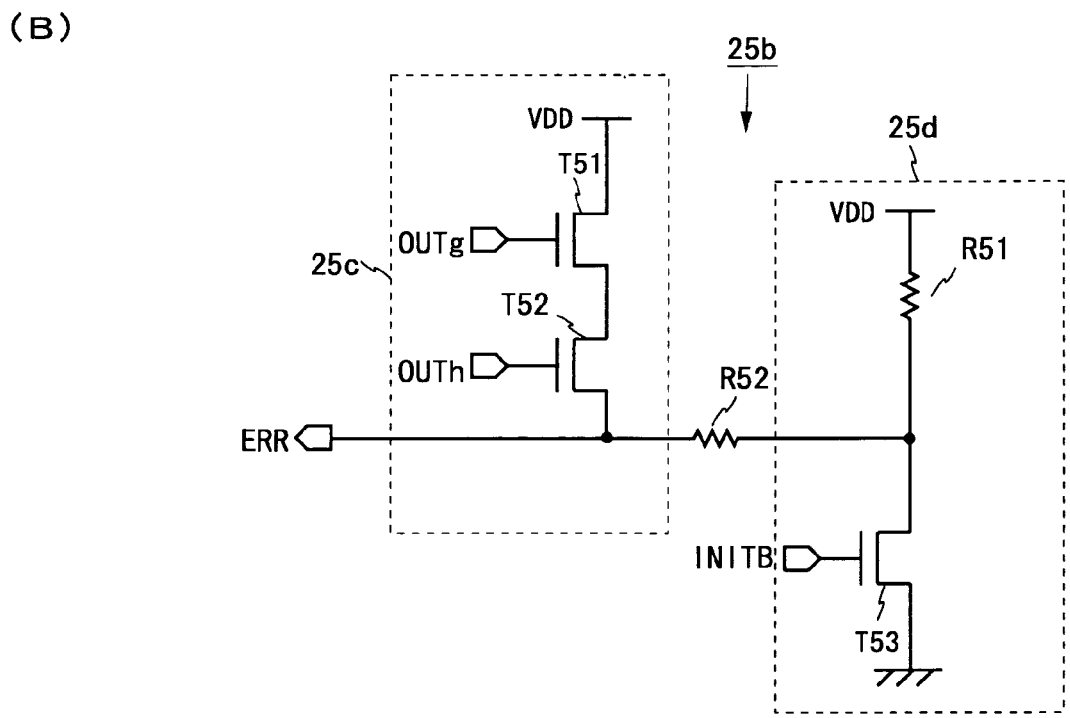

FIG. 15
(A)
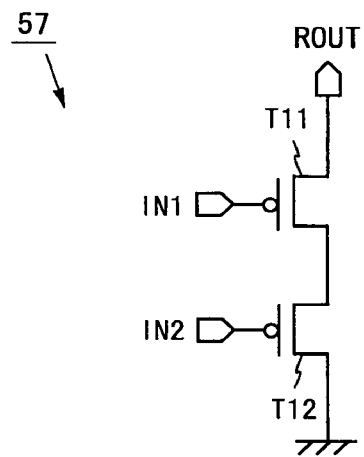
(B)
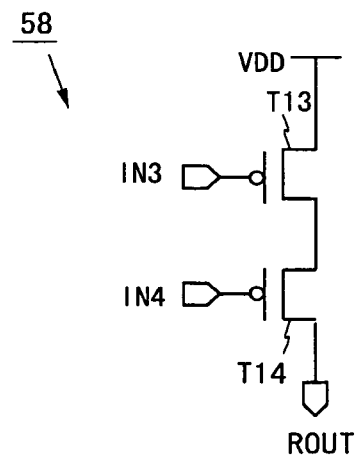

F I G. 1 8
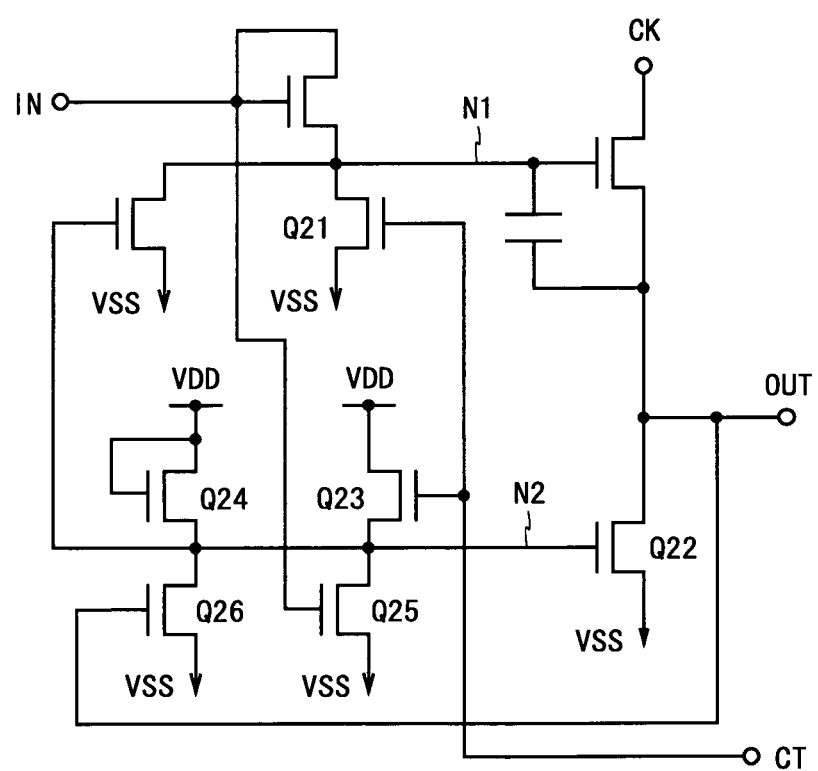

SHIFT REGISTER

TECHNICAL FIELD

The present invention relates to shift registers, particularly to a shift register preferably used for a driver circuit of a display device or an imaging device.

BACKGROUND ART

Active-matrix display devices display video by selecting two-dimensionally arranged pixel circuits row by row, and writing a voltage to the selected pixel circuits in accordance with data to be displayed. To select pixel circuits row by row, a shift register for sequentially shifting output signals based on clock signals is used as a scanning signal line driver circuit. Also, as for display devices in which dot-sequential drive is performed, a similar shift register is provided in a data signal line driver circuit.

For some liquid crystal display devices or suchlike, a production process intended to form TFTs (Thin Film Transistors) in pixel circuits is used for forming a pixel circuit driver circuit integrally with pixel circuits. In such a case, to reduce production cost, a driver circuit including a shift register is preferably formed using transistors of the same conductivity type as TFTs. Also, increasing the number of clock signals to be provided to the shift register results in an increased area for laying out clock wires and increased power consumption. Given such a background, the shift register is required to be configured to operate based on two-phase clock signals using transistors of the same conductivity type.

In shift registers configured by N-channel transistors, a bootstrap circuit shown in FIG. 16 is used to output clock signals without changing their voltage levels. In the circuit shown in FIG. 16, when an input signal IN is set to high level, a node $N_1$ is pre-charged to a potential of $(VDD-V_{th})$ (where VDD is a power-supply voltage, and $V_{th}$ is a threshold voltage of a transistor $T_1$), and a transistor $T_2$ is brought into on-state. Subsequently, when the input signal IN is set to low level, the node $N_1$ is brought into floating state, whereas the transistor $T_2$ maintains on-state.

In this state, when a clock signal CK changes from low level to high level, the potential of the node $N_1$ rises higher than VDD because of an action of a capacitance $C_1$ provided between gate and source terminals of the transistor $T_2$ (bootstrap effect). Thus, the clock signal CK, the maximum voltage of which is VDD, passes through the transistor $T_2$ without experiencing voltage drop, and an output terminal OUT outputs the clock signal CK without changing the voltage level.

To use the circuit shown in FIG. 16 to configure a shift register for use in a display device or suchlike, it is necessary to add a function of discharging the node $N_1$ and a function of pulling down an output signal OUT. In this regard, the following technology is conventionally known. It is described in Japanese Laid-Open Patent Publication No. 2001-273785 that a transistor $Q_{11}$ is used to discharge the node $N_1$ based on an output signal from a subsequent-stage circuit, and a transistor $Q_{12}$ is used to pull down the output signal OUT based on a clock signal $CK_2$, as shown in FIG. 17. It is described in Japanese Laid-Open Patent Publication No. 2002-258819 that based on an output signal CT from a subsequent-stage circuit, a transistor $Q_{21}$ is used to discharge the node $N_1$, and a transistor $Q_{22}$ is used to pull down the output signal OUT, as shown in FIG. 18.

[Patent Document 1] Japanese Laid-Open Patent Publication No. 2001-273785

[Patent Document 2] Japanese Laid-Open Patent Publication No. 2002-258819

DISCLOSURE OF THE INVENTION

Problems to be Solved by the Invention

In the above conventional circuits, however, if noise, such as ESD (electrostatic discharge), which is not assumed for normal drive, is applied to a shift register having unit circuits connected in multiple stages, a plurality of unit circuits might be simultaneously turned on to provide active output signals. Such a case results in increased load on clock signal lines and increased power consumption of an external power-supply circuit that supplies drive power to the shift register, which leads to a problem where instantaneous restoration to normal operation is not possible.

Therefore, an objective of the present invention is to provide a shift register capable of instantaneous restoration to normal operation even when a plurality of unit circuits connected in multiple stages are simultaneously turned on to provide active output signals.

Solution to the Problems

A first aspect of the present invention is directed to a shift register having a plurality of unit circuits connected in multiple stages and operating based on multiple-phase clock signals, the unit circuits being configured by transistors of the same conductivity type, the shift register comprising:

a detection circuit for outputting an active detection signal upon detection of the unit circuits being activated; and a restoration execution circuit for deactivating the unit circuits based on the active detection signal.

In a second aspect of the present invention, based on the first aspect of the invention, the unit circuits each include:

an output control transistor having one of the multiple-phase clock signals provided to a first conductive terminal and connected at a second conductive terminal to an output terminal;

a pre-charge circuit for providing an on-voltage to a control terminal of the output control transistor while an input signal is at on-level;

a discharge circuit for providing an off-voltage to the control terminal of the output control transistor; and an output reset transistor having an off-voltage provided to a first conductive terminal and connected at a second conductive terminal to the output terminal, and the restoration execution circuit activates the discharge circuit, thereby providing an off-voltage to the control terminal of the output control transistor.

In a third aspect of the present invention, based on the second aspect of the invention, the restoration execution circuit outputs an on-voltage to a control terminal of the output reset transistor.

In a fourth aspect of the present invention, based on the second aspect of the invention, the unit circuits each include the detection circuit and the restoration execution circuit, and the detection circuit outputs the active detection signal upon detection of output signals being activated, one being selected from among output signals from its preceding unit circuits, one being selected from among output signals from its succeeding unit circuits.

In a fifth aspect of the present invention, based on the second aspect of the invention, the unit circuits each include the restoration execution circuit, and the detection circuit provides the active detection signal to the unit circuits upon detection of all output signals from two or more unit circuits being activated, the two or more unit circuits being arbitrarily selected from either even- or odd-numbered-stage unit circuits connected to the same clock signal line.

In a sixth aspect of the present invention, based on the fifth aspect of the invention, the detection circuit further includes an initialization circuit to be activated upon reception of an external initialization signal, and the restoration execution circuit activates the discharge circuit upon activation of the initialization circuit.

In a seventh aspect of the present invention, based on the sixth aspect of the invention, the restoration execution circuit provides an on-voltage to the control terminal of the output reset transistor upon activation of the initialization circuit.

In an eighth aspect of the present invention, based on the second aspect of the invention, the unit circuits each include the restoration execution circuit, and the detection circuit detects the number of activated unit circuits based on outputs from all the unit circuits, and outputs an active detection signal corresponding to the number.

In a ninth aspect of the present invention, based on the eighth aspect of the invention, the detection circuit includes:
a number detection circuit for outputting a number detection signal corresponding to the number of activated unit circuits among the plurality of unit circuits, and
a signal output circuit for outputting an active detection signal to the detection circuit when the number detection signal from the number detection circuit exceeds a predetermined range,
the number detection circuit includes:
a resistive element, and
a plurality of parallel-connected transistors connected at their gate terminals to their respective output terminals of the unit circuits, the transistors being connected at their first conductive terminals to one terminal of the resistive element, and
a potential at a connection point between the resistive element and the first conductive terminal of each of the transistors is outputted to the signal output circuit.

A tenth aspect of the present invention is directed to a shift register having a plurality of unit circuits connected in multiple stages and operating based on multiple-phase clock signals, the unit circuits being configured by transistors of the same conductivity type, the shift register comprising:
a malfunction restoration circuit for restoring the shift register to normal operation upon malfunction, wherein,
the unit circuits each include:
an output control transistor having one of the multiple-phase clock signals provided to a first conductive terminal and connected at a second conductive terminal to an output terminal;
a pre-charge circuit for providing an on-voltage to a control terminal of the output control transistor while an input signal is at on-level;
a discharge circuit for providing an off-voltage to the control terminal of the output control transistor; and
an output reset transistor having an off-voltage provided to a first conductive terminal and connected at a second conductive terminal to the output terminal, and
the malfunction restoration circuit includes:
a detection circuit for outputting an active detection signal upon detection of the unit circuits being activated; and
a restoration execution circuit for deactivating the unit circuits based on the active detection signal.

In an eleventh aspect of the present invention, based on the tenth aspect of the invention, further comprised is a reset signal generation circuit for generating a reset signal which is normally at on-level and changes to off-level when the input signal is set to on-level, wherein,
the reset signal generation circuit includes:
a first transistor having one of the multiple-phase clock signals provided to a control terminal, the provided signal being the same as that provided to the first conductive terminal of the output control transistor;
a second transistor having one of the multiple-phase clock signals provided to a control terminal, the provided signal differing from that provided to the first conductive terminal of the output control transistor, the second transistor being connected at a first conductive terminal to a second conductive terminal of the first transistor; and
a third transistor having the input signal provided to a control terminal, connected at a first conductive terminal to a second conductive terminal of the second transistor, and having an off-voltage provided to a second conductive terminal, and
a connection point between the second and third transistors is connected to a control terminal of the output reset transistor.

A twelfth aspect of the present invention is characterized by comprising a plurality of two-dimensionally arranged pixel circuits and a driver circuit including a shift register of any of the first to eleventh aspects of the invention, wherein the pixel circuits and the shift register are configured using transistors of the same conductivity type.

Effect of the Invention

According to the first aspect of the invention, the shift register operating based on multiple-phase clock signals can deactivate and instantaneously restore all unit circuits to normal operation upon detection of malfunction caused by activation of a plurality of unit circuits.

According to the second aspect of the invention, upon detection of malfunction of a plurality of unit circuits, the restoration execution circuit outputs an on-voltage, thereby activating the discharge circuit. When the discharge circuit is activated, the output control transistor is brought into off-state, so that one conductive terminal to which the clock signal is provided and the output terminal are shut off. As a result, load on the clock signal line is alleviated, and an on-voltage can be instantaneously provided to the control terminal of the output reset transistor, so that an off-voltage is outputted to the output terminal. In this manner, when the unit circuit malfunctions, it is possible to instantaneously restore the unit circuit to normal operation by forcibly pulling down the output signal.

According to the third aspect of the invention, an on-voltage provided by the restoration execution circuit brings the output reset transistor into on-state, and causes the output reset transistor to output an off-voltage to the output terminal. Thus, when the unit circuit malfunctions, it is possible to instantaneously restore the unit circuit to normal operation by forcibly pulling down the output signal.

According to the fourth aspect of the invention, when the detection circuit included in unit circuit detects malfunction of the shift register based on output signals from its preceding and succeeding unit circuits, the restoration execution circuit included in the unit circuit instantaneously restores the unit circuit to normal operation.

According to the fifth aspect of the invention, the detection circuit included in the unit circuit detects whether or not the shift register is in malfunction based on output signals from two or more unit circuits arbitrarily selected from either even- or odd-numbered-stage unit circuits connected to the same clock signal line. Then, when the detection indicates malfunction, the unit circuit is restored to normal operation by the restoration execution circuit included therein.

According to the sixth aspect of the invention, when the initialization circuit is activated, the restoration execution circuit activates the discharge circuit, thereby bringing the output control transistor into off-state, so that one conductive terminal to which the clock signal is provided and the output terminal are shut off. As a result, load on the clock signal line is alleviated, and an on-voltage can be instantaneously provided to the control terminal of the output reset transistor, so that an off-voltage is outputted to the output terminal. In this manner, when the unit circuit malfunctions, it is possible to initialize the unit circuit by forcibly pulling down the output signal. Furthermore, the restoration execution circuit can also be used for initializing the unit circuit, and therefore it is possible to minimize increase in circuit complexity of the shift register provided with the initialization function.

According to the seventh aspect of the invention, when the initialization circuit is activated, the restoration execution circuit brings the output reset transistor into on-state. As a result, an off-voltage is outputted to the output terminal, initializing the unit circuit. Thus, the same effect can be achieved as in the sixth invention.

According to the eighth aspect of the invention, by causing the restoration execution circuit included in the unit circuit to operate based on a detection signal corresponding to the number of active unit circuits, the unit circuit can be instantaneously restored to normal operation upon malfunction.

According to the ninth aspect of the invention, malfunction of the shift register can be detected based on whether or not a number detection signal, which is generated based on on-resistances of transistors each being connected to their respective unit circuits, is within a predetermined range. Also, the predetermined range for the number detection signal can be changed by adjusting resistance values of resistive elements connected in series with the transistors.

According to the tenth aspect of the invention, when the detection circuit detects malfunction of a plurality of unit circuits, the restoration execution circuit can instantaneously restore all the unit circuits in malfunction to normal operation.

According to the eleventh aspect of the invention, when the shift register malfunctions, the restoration execution circuit brings the output control transistor into off-state, thereby alleviating load on the clock signal line. On the other hand, when load on the clock signal line is alleviated, the reset signal generation circuit can instantaneously generate an on-voltage reset signal. When the generated reset signal is provided to the control terminal of the output reset transistor, the output reset transistor is brought into on-state. Thus, the unit circuit can be instantaneously restored to normal operation by forcibly pulling down the output signal.

According to the twelfth aspect of the invention, it is possible to achieve a display device including a shift register that can be instantaneously restored to normal operation upon malfunction.

BRIEF DESCRIPTION OF THE DRAWINGS

FIG. 2 is a circuit diagram of a unit circuit included in the shift register shown in FIG. 1.

FIG. 3 is a circuit diagram of a malfunction restoration circuit included in the unit circuit shown in FIG. 2.

FIG. 10 is a timing chart where the shift register shown in FIG. 8 is in malfunction.

FIG. 11(A) is a circuit diagram of a malfunction detection circuit.

FIG. 11(B) is another circuit diagram of a malfunction detection circuit.

FIG. 12(A) is a circuit diagram of a malfunction detection circuit.

FIG. 12(B) is another circuit diagram of a malfunction detection circuit.

FIG. 15(A) is a circuit diagram of a malfunction restoration circuit.

FIG. 15(B) is another circuit diagram of a malfunction restoration circuit.

FIG. 18 is a circuit diagram illustrating the configuration of another conventional shift register.

DESCRIPTION OF THE REFERENCE CHARACTERS

Figure 1:
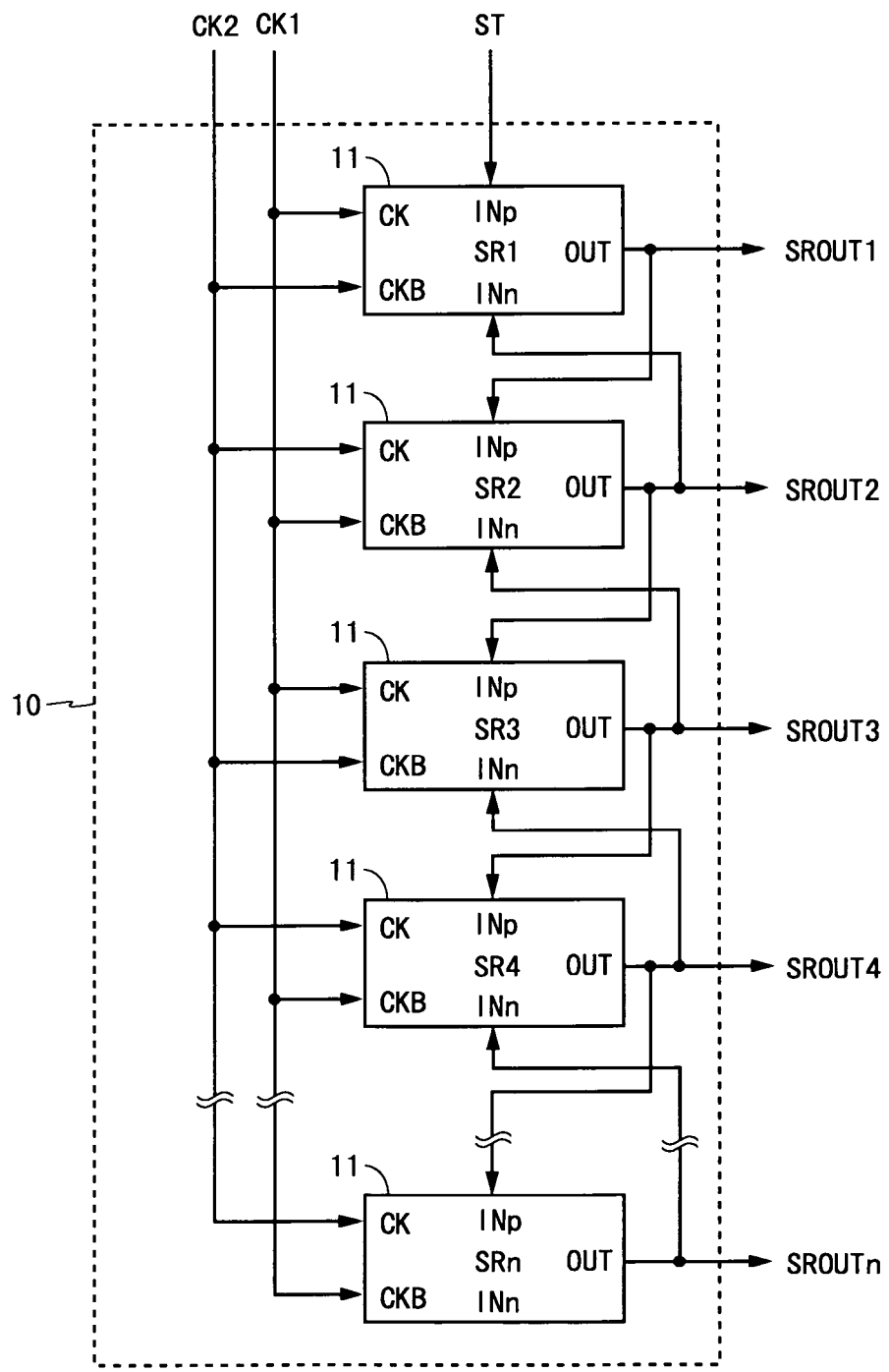
FIG. 1 is a block diagram illustrating the configuration of a shift register according to a first embodiment of the present invention.

10, 20, 30 shift register
11, 21, 31, 51 unit circuit
12 reset signal generation circuit
13 pre-charge circuit
17, 18 malfunction restoration circuit
19 restoration execution circuit
20b, 22b, 23b, 24b, 25b malfunction detection circuit
23d, 24d, 25d initialization portion
110, 120 liquid crystal display device
111, 121 pixel array
112, 122 display control circuit
113, 123 scanning signal line driver circuit
114, 124 data signal line driver circuit

BEST MODE FOR CARRYING OUT THE INVENTION

1. First Embodiment

FIG. 1 is a block diagram illustrating the configuration of a shift register 10 according to a first embodiment of the present invention. The shift register 10 shown in FIG. 1 is configured by connecting n (where n is an integer of 2 or more) unit circuits 11 in multiple stages. Each of the unit circuits 11 has clock terminals CK and CKB, input terminals $IN_p$ and $IN_n$, and an output terminal OUT. Hereinafter, a signal which is inputted/outputted via a terminal is referred to by the same name as that terminal (e.g., a signal which is inputted via the clock terminal CK is referred to as a clock signal CK).

The shift register 10 is externally supplied with a start pulse ST and two-phase clock signals $CK_1$ and $CK_2$. The start pulse ST is provided to the input terminal $IN_p$ of the first-stage unit circuit 11. The clock signal $CK_1$ is provided to the clock terminals CK of odd-numbered-stage unit circuits 11 and the clock terminals CKB of even-numbered-stage unit circuits 11. The clock signal $CK_2$ is provided to the clock terminals CKB of the odd-numbered-stage unit circuits 11 and the clock terminals CK of the even-numbered-stage unit circuits 11. Output signals $SROUT_1$ to $SROUT_n$ are externally provided from their respective output terminals of the unit circuits 11, and they are also provided to the input terminals $IN_p$ of their respective subsequent-stage unit circuits 11 and the input terminals $IN_n$ of their respective previous-stage unit circuits 11. In this shift register 10, a unit circuit 11 numbered one lower in accordance with the direction in which the unit circuits 11 are assigned lower numbers (in FIG. 1, the direction to the top) is referred to as a previous-stage unit circuit, while a unit circuit 11 numbered one higher in accordance with the opposite direction (in FIG. 1, the direction to the bottom) is referred to as a subsequent-stage unit circuit.

FIG. 2 is a circuit diagram of the unit circuit 11 included in the shift register 10. The unit circuit 11 shown in FIG. 2 is configured by transistors of the same conductivity type, including 7 N-channel transistors $T_1$ to $T_7$, three capacitances $C_1$ to $C_3$, and two malfunction restoration circuits 17 and 18. Hereinafter, a voltage (signal level) which brings a transistor into on-state when provided to its gate terminal is referred to as an on-voltage (on-level), while a voltage (signal level) which brings a transistor into off-state when provided to its gate terminal is referred to as an off-voltage (off-level). In the case of the N-channel transistor, a high voltage acts as an on-voltage (a high level corresponds to an on-level), and a low voltage acts as an off-voltage (a low level corresponds to an off level); the opposite is true for the P-channel transistor.

The transistor $T_1$ has a power-supply voltage VDD provided to a drain terminal and is connected at a gate terminal to the input terminal $IN_p$. The transistor $T_1$ is connected at a source terminal to a gate terminal of the transistor $T_2$ and a drain terminal of the transistor $T_4$. Hereinafter, the connection point is referred to as a node $N_1$. The transistor $T_2$ is connected at a drain terminal to the clock terminal CK and at a source terminal to the output terminal OUT and a drain terminal of the transistor $T_3$. The transistors $T_3$ and $T_4$ are grounded at their source terminals.

The transistor $T_5$ has the power-supply voltage VDD provided to a drain terminal, and is connected at a source terminal to a drain terminal of the transistor $T_6$. The transistor $T_6$ is connected at a source terminal to a drain terminal of the transistor $T_7$, and the transistor $T_7$ is grounded at a source terminal. The transistors $T_5$ to $T_7$ are connected at their gate terminals to the clock terminals CK and CKB and the input terminal $IN_p$, respectively. The connection point between the source terminal of the transistor $T_6$ and the drain terminal of the transistor $T_7$ is also connected to the gate terminals of the transistors $T_3$ and $T_4$. Hereinafter, the connection point is referred to as the node $N_2$, and the connection point between the source terminal of the transistor $T_5$ and the drain terminal of the transistor $T_6$ is referred to as a node $N_3$.

The capacitances $C_1$ to $C_3$ are configured by capacitative elements. The capacitance $C_1$ is provided between the gate and source terminals of the transistor $T_2$, the capacitance $C_2$ is provided between the node $N_3$ and a ground terminal, and the capacitance $C_3$ is provided between the node $N_2$ and the ground terminal. The capacitance $C_1$ functions as a bootstrap capacitance, and the capacitances $C_2$ and $C_3$ function as charge-pump capacitances. The capacitance values of the capacitances $C_2$ and $C_3$ are assumed to be equal below.

In the unit circuit 11, the transistors $T_5$ to $T_7$ and the capacitances $C_2$ and $C_3$ form a reset signal generation circuit 12, the transistors $T_1$ to $T_4$ respectively function as a pre-charge circuit 13, an output control transistor, an output reset transistor, and a discharge circuit. The transistor $T_2$ switches between outputting and not outputting the clock signal CK from the output terminal OUT in accordance with the potential of the gate terminal. The transistor $T_1$ provides a high voltage to the node $N_1$ (the gate terminal of the transistor $T_2$) while the input signal $IN_p$ is set at high level. The reset signal generation circuit 12 generates a reset signal which is normally at high level and changes to low level when the input signal $IN_p$ is set to high level. The transistor $T_4$ provides a low voltage to the node $N_1$ while the reset signal is set at high level. The transistor $T_3$ provides a low voltage to the output terminal OUT while the reset signal is set at high level.

The malfunction restoration circuit 17 is connected at an input terminal $IN_1$ to the input terminal $IN_p$ and at an input terminal $IN_2$ to the input terminal $IN_n$. The output terminal $ROUT_1$ is connected to the node $N_2$. Also, the malfunction restoration circuit 18 is connected at an input terminal $IN_3$ to the input terminal $IN_p$ and at an input terminal $IN_4$ to the input terminal $IN_n$. The output terminal $ROUT_2$ is connected to the node $N_1$.

FIG. 3(A) is a circuit diagram of the malfunction restoration circuit 17 provided in the unit circuit 11. The malfunction restoration circuit 17 shown in FIG. 3(A) includes two N-channel transistors $T_{11}$ and $T_{12}$, and the transistor $T_{11}$ has a power-supply voltage VDD provided to a drain terminal and is connected at a source terminal to a drain terminal of the transistor $T_{12}$. The transistor $T_{12}$ is connected at a source terminal to the output terminal $ROUT_1$. Also, the transistor $T_{11}$ is connected at a gate terminal to the input terminal $IN_1$, and the transistor $T_{12}$ is connected at a gate terminal to the input terminal $IN_2$. Accordingly, the transistors $T_{11}$ and $T_{12}$ are brought into on-state only when high-level input signals $IN_1$ and $IN_2$ are provided to their respective gate terminals, so that the malfunction restoration circuit 17 outputs a high voltage from the output terminal $ROUT_1$ to the node $N_2$.

FIG. 3(B) is a circuit diagram of the malfunction restoration circuit 18 provided in the unit circuit 11. The malfunction restoration circuit 18 shown in FIG. 3(B) includes two N-channel transistors $T_{13}$ and $T_{14}$, and the transistor $T_{14}$ is grounded at a source terminal and is connected at a drain terminal to a source terminal of the transistor $T_{13}$. The transistor $T_{13}$ is connected at a drain terminal to the output terminal $ROUT_2$. Also, the transistor $T_{13}$ is connected at a gate terminal to the input terminal $IN_3$, and the transistor $T_{14}$ is connected at a gate terminal to the input terminal $IN_4$. Accordingly, the transistors $T_{13}$ and $T_{14}$ are brought into on-state only when high-level input signals $IN_3$ and $IN_4$ are provided to their respective gate terminals, so that the malfunction restoration circuit 18 outputs a low voltage from the output terminal $ROUT_2$ to the node $N_1$.

Figure 4:
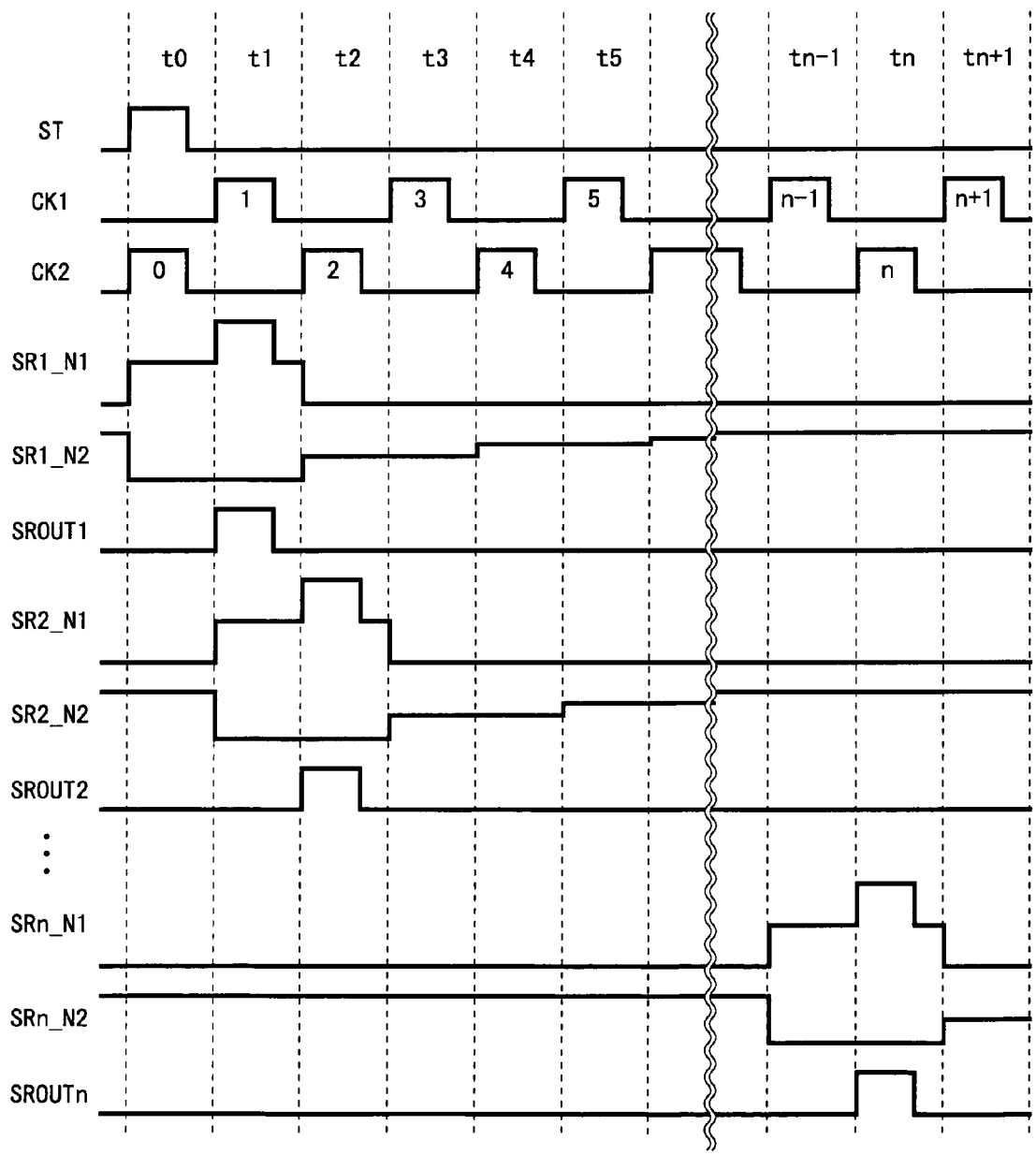
FIG. 4 is a timing chart for normal operation of the shift register shown in FIG. 1.

FIG. 4 is a timing chart for the shift register 10 in normal operation. In FIG. 4, periods $t_0$ to $t_{n+1}$ are each divided into first and second sections. The start pulse ST is set to high level during the first section of period $t_0$, the clock signal $CK_1$ is set to high level during the first section of period $t_{od}$ (where od is an odd number; hereinafter, referred to as an odd-numbered period), and the clock signal $CK_2$ is set to high level during the first section of period $t_{ev}$ (where ev is an even number; hereinafter, referred to as an even-numbered period). During other periods, these three signals are set at low level. In this manner, the clock signals $CK_1$ and $CK_2$ behave such that their high-level periods do not overlap. Hereinafter, unless otherwise specified, potentials of signals inside the shift register 10 and input/output signals, including the clock signals $CK_1$ and $CK_2$, are at VDD when the signals are at high level and at VSS (zero) when they are at low level.

Here, the shift register 10 in normal operation generally refers to the case where the shift register 10 sequentially outputs a predetermined number of high-voltage output signals at a time. However, in the following descriptions, the shift register 10 in normal operation refers to the case where one high-voltage output signal is outputted at a time, and the shift register 10 in malfunction refers to the case where the shift register 10 sequentially outputs two or more high-voltage output signals at the same time.

When the start pulse ST shown in FIG. 4 is provided as the input signal $IN_p$, the first-stage unit circuit 11 (hereinafter, referred to as the unit circuit $SR_1$) operates as described below. In the unit circuit $SR_1$, the input signal $IN_p$ is set to high level during the first section of period $t_0$, the clock signal CK is set to high level during the first sections of the odd-numbered periods, and the clock signal CKB is set to high level during the first sections of the even-numbered periods.

Before period $t_0$, the input signal $IN_p$ is set at low level, and therefore the transistors $T_1$ and $T_7$ are in off-state. At this time, the potentials of the nodes $N_2$ and $N_3$ are set at VDD (the reason for which will be described later), and therefore the transistors $T_3$ and $T_4$ are in on-state. Accordingly, the potentials of the node $N_1$ and the first output terminal OUT are set at VSS, and therefore the transistor $T_2$ is in off-state. At this time, the capacitance $C_1$ has no charge accumulated therein, and the capacitances $C_2$ and $C_3$ have accumulated therein a charge corresponding to the power-supply voltage VDD.

During the first section of period $t_0$, the input signal $IN_p$ and the clock signal CKB are set to high level, and therefore the transistors $T_1$, $T_6$, and $T_7$ are brought into on-state. As a result, the charges accumulated in the capacitances $C_2$ and $C_3$ are released, so that the potentials of the nodes $N_2$ and $N_3$ are set to VSS, and the transistors $T_3$, $T_4$, and $T_{32}$ are brought into off-state. Also, when the transistor $T_1$ is brought into on-state, the potential of the node $N_1$ is set to (VDD–$V_{th}$) (where $V_{th}$ is a threshold voltage of the transistor $T_1$), and the transistors $T_2$ and $T_{31}$ are brought into on-state. At this time, the clock signal CK is set at low level, and therefore the output signal OUT remains at low level. Accordingly, the capacitance $C_1$ has accumulated therein a charge corresponding to the difference (VDD–$V_{th}$) in potential between the gate and the source of the transistor $T_2$.

During the second section of period $t_0$, the input signal $IN_p$ and the clock signal CKB are set to low level, and therefore the transistors $T_1$, $T_6$, and $T_7$ are brought into off-state. When the transistor $T_1$ is brought into off-state, the node $N_1$ is brought into floating state, but the capacitance $C_1$ maintains the potential of the node $N_1$ at (VDD–$V_{th}$).

During the first section of period $t_1$, the clock signal CK is set to high level. At this time, the transistors $T_2$ and $T_{31}$ are in on-state, the output signal OUT is set to high level. The node $N_1$ is in floating state, and the node $N_1$ and the source terminal of the transistor $T_2$ are connected via the capacitance $C_1$ maintaining the potential difference (VDD–$V_{th}$), so that when the potential at the source terminal of the transistor $T_2$ changes from VSS to VDD, the potential of the node changes by the same amount to be higher than the power-supply voltage VDD (bootstrap effect). As a result, the clock signal CK, the maximum voltage of which is VDD, passes through the transistor $T_2$ without voltage drop, and the output terminal OUT outputs the clock signal CK at the same voltage level. Also, when the clock signal CK is set to high level, the transistor $T_5$ is brought into on-state. At this time, the transistor $T_6$ is in off-state, and therefore the potential of the node $N_3$ is set to VDD, so that the capacitance $C_2$ has accumulated therein a charge corresponding to the power-supply voltage VDD.

During the second section of period $t_1$, the clock signal CK is set to low level. At this time, the transistors $T_2$ and $T_{31}$ are in on-state, and therefore the output signal OUT is also set to low level, so that the potential of the node $N_1$ returns to (VDD–$V_{th}$). Also, the transistor $T_5$ is brought into off-state. At the end of period $t_1$, the potential of the node $N_2$ is set at VSS, and the potential of the node $N_3$ is set at VDD.

During the first section of period $t_2$, the clock signal CKB is set to high level, and therefore the transistor $T_6$ is brought into on-state. At this time, the charge accumulated in the capacitance $C_2$ partially moves to the capacitance $C_3$, so that the potential of the node $N_2$ rises. When the capacitances $C_2$ and $C_3$ are equal in capacitance value, the nodes $N_2$ and $N_3$ are equalized in potential, so that the potential of the node $N_2$ rises to VDD/2. When determining the capacitance values of the capacitances $C_2$ and $C_3$, they are determined such that the potential of the node $N_2$ at that time is higher than the threshold voltages of the transistors $T_3$ and $T_4$. Therefore, during the first section of period $t_2$, the transistors $T_3$, $T_4$ and $T_{32}$ are brought into on-state, and the potentials of the node $N_1$ and the output terminal OUT are set to VSS.

Subsequently, the reset signal generation circuit in the unit circuit $SR_1$ operates as described below. During the first sections of the odd-numbered periods, the clock signals CK and CKB are set to high and low levels, respectively, and therefore the transistors $T_5$ and $T_6$ are brought into on- and off-states, respectively. At this time, the potential of the node $N_3$ is set to VDD, so that the capacitance $C_2$ has accumulated therein a charge corresponding to the power-supply voltage VDD. On the other hand, during the first sections of the even-numbered periods, the clock signals CK and CKB are set to low and high levels, respectively, and therefore the transistors $T_5$ and $T_6$ are brought into off- and on-states, respectively. At this time, the charge accumulated in the capacitance $C_2$ partially moves to the capacitance $C_3$, so that the potential of the node $N_2$ rises. When the capacitances $C_2$ and $C_3$ are equal in capacitance value, the potential of the node $N_2$ gradually rises and ultimately reaches VDD.

As a result, as shown in FIG. 4, the potential (indicated as SR1_N1; the same applies below) of the node $N_1$ in the unit circuit $SR_1$ is set to (VDD–$V_{th}$) during period $t_0$ and the second section of period $t_1$, to a level higher than VDD during the first section of period $t_1$, and to VSS during other periods. The potential of the node $N_2$ in the unit circuit $SR_1$ is set to VSS during periods $t_0$ and $t_1$, and it gradually rises during period $t_2$ and periods subsequent thereto and ultimately reaches VDD. The output signal OUT (the output signal $SROUT_1$) from the unit circuit $SR_1$ is set to high level during the first section of period $t_1$ and to low level during other periods. The output signal $SROUT_1$ is provided as an output signal of the shift register 10 and also as an input signal $IN_p$ from the second-stage unit circuit $SR_2$.

Similarly, the output signal OUT (the output signal $SROUT_i$) from the i'th-stage (where i is an integer from 1 to n) unit circuit 11 (hereinafter, referred to as the unit circuit $SR_i$) is set to high level during the first section of period $t_i$ and to low level during other periods. The output signal $SROUT_i$ is outputted as an output signal from the shift register 10. In this manner, the shift register 10 sequentially sets the output signals $SROUT_1$ to $SROUT_n$ to high level one at a time based on the two-phase clock signals $CK_1$ and $CK_2$. Note that the output signal $SROUT_i$ is outputted to the (i−1)'th-stage unit circuit $SR_{(i-1)}$ as the input signal $IN_n$ and also to the (i+1)-stage unit circuit $SR_{(i+1)}$ as the input signal $IN_p$.

In the case where the shift register 10 is in normal operation, when the output signal $SROUT_i$ from the unit circuit $SR_i$ is at high level, the output signals $SROUT_{(i-1)}$ and $SROUT_{(i+1)}$ from the unit circuit $SR_{(i-1)}$ and the unit circuit $SR_{(i+1)}$, which are respectively previous and subsequent thereto, are both at low level. Therefore, the input signals $IN_p$ and $IN_n$ provided to the unit circuits $SR_i$ are set to low level, and the malfunction restoration circuits 17 and 18 do not operate, so that their output terminals $ROUT_1$ and $ROUT_2$ are both brought into high-impedance state.

Figure 5:
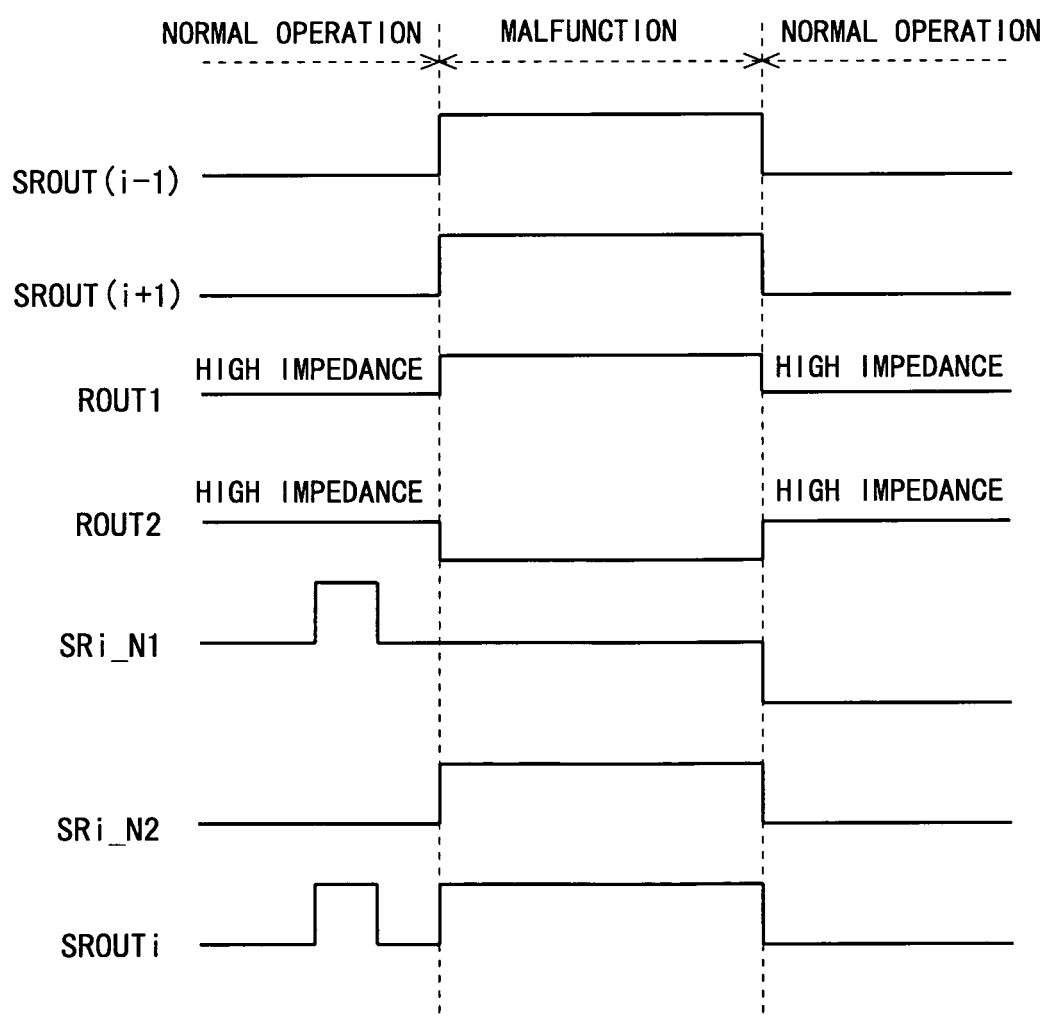
FIG. 5 is a timing chart where the shift register shown in FIG. 1 is in malfunction.

Described next is a case where the shift register 10 which malfunctions due to noise is restored to normal operation. FIG. 5 is a timing chart for restoring the shift register 10 to normal operation upon malfunction of the shift register 10 in normal operation.

When the shift register 10 is in normal operation, the unit circuit $SR_i$ has low-level output signals $SROUT_{(i-1)}$ and $SROUT_{(i+1)}$ respectively provided to the input terminals $IN_p$ and $IN_n$ from the previous- and subsequent-stage unit circuits $SR_{(i-1)}$ and $SR_{(i+1)}$. As a result, both the output terminals $ROUT_1$ and $ROUT_2$ of the malfunction restoration circuits 17 and 18 in the unit circuit $SR_i$ are brought into high-impedance state, so that neither a high nor low voltage is outputted. At this time, the output terminal OUT of the unit circuit $SR_i$ outputs a high-level output signal $SROUT_i$, as shown in the timing chart of FIG. 4.

Next, when the unit circuits $SR_{(i-1)}$ and $SR_{(i+1)}$ malfunction, high-level output signals $SROUT_{(i-1)}$ and $SROUT_{(i+1)}$ are provided to the input terminals $IN_p$ and $IN_n$, respectively. In this case, the high-level input signal $IN_p$ is inputted to the input terminals $IN_1$ and $IN_3$ of the malfunction restoration circuits 17 and 18, and the high-level input signal $IN_n$ is inputted to the input terminals $IN_2$ and $IN_4$. Accordingly, the malfunction restoration circuit 17 outputs a high voltage from the output terminal $ROUT_1$ to the node $N_2$, and the malfunction restoration circuit 18 outputs a low voltage from the output terminal $ROUT_2$ to the node $N_1$.

The potential of the node $N_2$ is set to $(VDD-V_{th})$ (where $V_{th}$ is a threshold voltage of each of the transistors $T_{11}$ and $T_{12}$), and therefore both the transistors $T_3$ and $T_4$ are brought into on-state. Accordingly, the potential of the output terminal OUT is set to VSS, so that the output signal $SROUT_i$ is forcibly pulled down. Also, the node $N_1$ is discharged, and therefore the potential thereof is set to VSS, resulting in no difference in potential between the gate and the source of the transistor $T_2$, so that the charge accumulated in the capacitance $C_1$ is forcibly released.

In this manner, the output signal $SROUT_i$ is set to low level. Similarly, in the unit circuits $SR_{(i-1)}$ and $SR_{(i+1)}$ also, the output signals $SROUT_{(i-1)}$ and $SROUT_{(i+1)}$ are set to low level. Accordingly, the shift register 10 can be restored from malfunction instantaneously.

Figure 6:
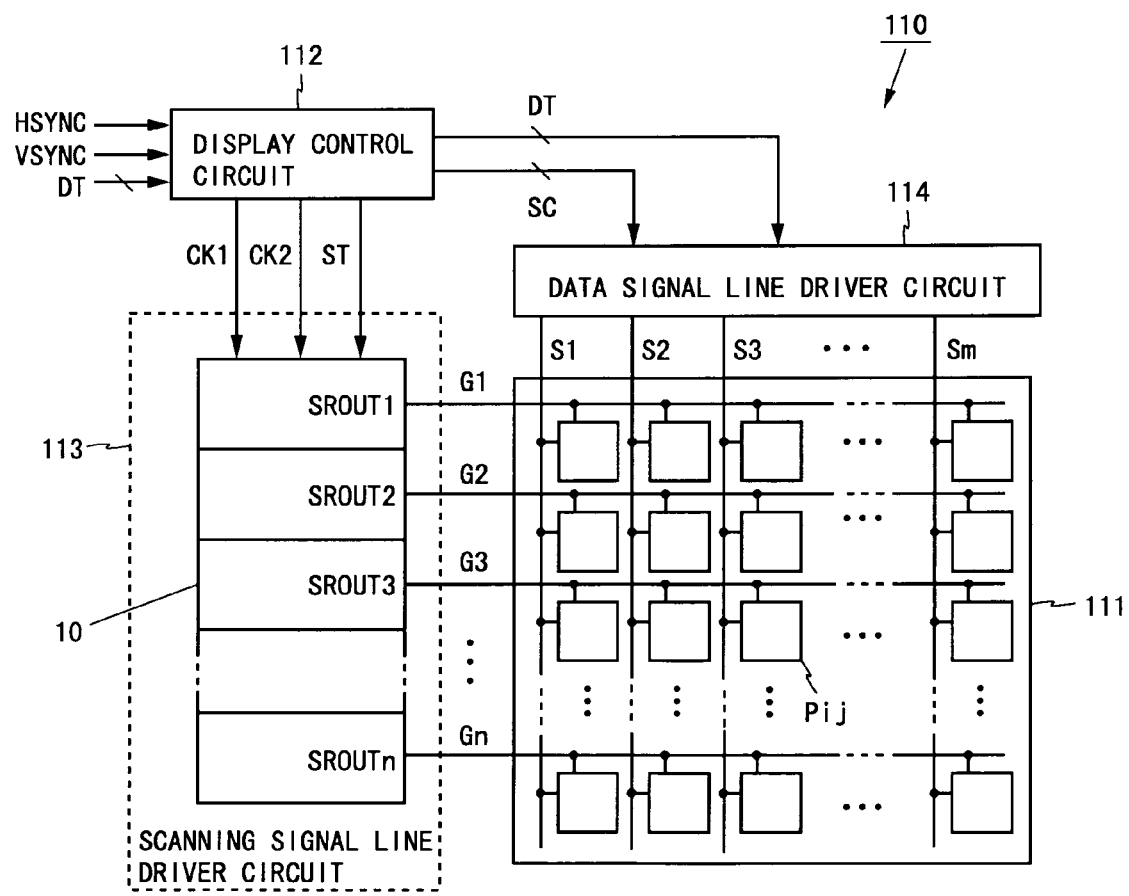
FIG. 6 is a block diagram illustrating the configuration of a liquid crystal display device provided with the shift register shown in FIG. 1.

The shift register 10 can be used in a driver circuit of a display device or an imaging device, for example. FIG. 6 is a block diagram illustrating the configuration of a liquid crystal display device provided with a shift register 10. The liquid crystal display device 110 shown in FIG. 6 is an active-matrix display device provided with a pixel array 111, a display control circuit 112, a scanning signal line driver circuit 113, and a data signal line driver circuit 114. In the liquid crystal display device 110, the shift register 10 is used as the scanning signal line driver circuit 113.

The pixel array 111 shown in FIG. 6 includes n scanning signal lines $G_1$ to $G_n$, m data signal lines $S_1$ to $S_m$, and (m×n) pixel circuits $P_{ij}$ (where m is an integer of 2 or more, and j is an integer from 1 to m). The scanning signal lines $G_1$ to $G_n$ are arranged parallel to one another, and the data signal lines $S_1$ to $S_m$ are arranged parallel to one another so as to be perpendicular to the scanning signal lines $G_1$ to $G_n$. The pixel circuit $P_{ij}$ is disposed in the vicinity of the intersection of the scanning signal line $G_i$ and the data signal line $S_j$. In this manner, the (m×n) pixel circuits $P_{ij}$ are arranged two-dimensionally with each row including m of them and each column including n of them. The scanning signal line $G_i$ is connected commonly to the pixel circuits $P_{ij}$ arranged in the i'th row, and the data signal line $S_j$ is connected commonly to the pixel circuits $P_{ij}$ arranged in the j'th column.

From the outside of the liquid crystal display device 110 are supplied control signals, such as a horizontal synchronization signal HSYNC and a vertical synchronization signal VSYNC, and display data DT. Based on these signals, the display control circuit 112 outputs clock signals $CK_1$ and $CK_2$ and a start pulse ST to the scanning signal line driver circuit 113, and also outputs a control signal SC and the display data DT to the data signal line driver circuit 114.

The scanning signal line driver circuit 113 is configured by an n-stage shift register 10. Based on the clock signals $CK_1$ and $CK_2$, the shift register 10 sequentially sets output signals $SROUT_1$ to $SROUT_n$ to high level (selected state) one by one. The output signals $SROUT_1$ to $SROUT_n$ are provided to the scanning signal lines $G_1$ to $G_n$, respectively. As a result, the scanning signal lines $G_1$ to $G_n$ are sequentially selected one at a time, so that pixel circuits $P_{ij}$ for one row are collectively selected.

Based on the control signal SC and the display data DT, the data signal line driver circuit 114 provides to the data signal lines $S_1$ to $S_m$ a voltage corresponding to the display data DT. As a result, the voltage corresponding to the display data DT is written to the selected pixel circuits $P_{ij}$ for one row. In this manner, the liquid crystal display device 110 displays video.

Figure 7:
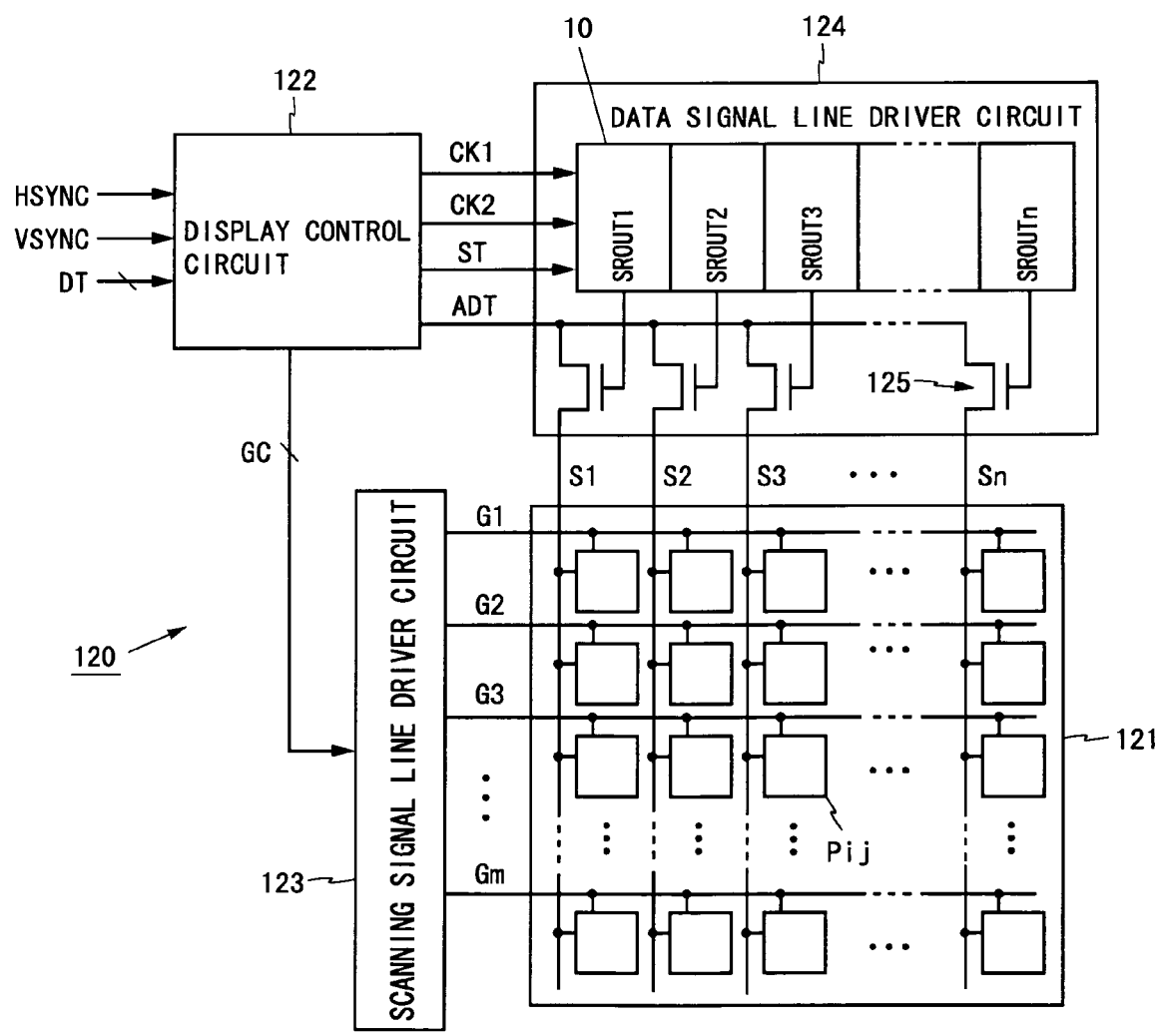
FIG. 7 is a block diagram illustrating the configuration of another liquid crystal display device provided with the shift register shown in FIG. 1.

FIG. 7 is a block diagram illustrating the configuration of another liquid crystal display device 120 provided with a shift register 10. The liquid crystal display device 120 shown in FIG. 7 is an active-matrix display device provided with a pixel array 121, a display control circuit 122, a scanning signal line driver circuit 123, and a data signal line driver circuit 124. In the liquid crystal display device 120, the shift register 10 is included and used in the data signal line driver circuit 124 which performs dot-sequential drive.

The pixel array 121 shown in FIG. 7 is configured in the same manner as the pixel array 111 shown in FIG. 6. However, in the pixel array 121, the number of scanning signal lines is m, the number of data signal lines is n, and (m×n) pixel arrays $P_{ij}$ are provided two-dimensionally with each row including n of them and each column including m of them.

Based on control signals and display data DT, which are externally supplied, the display control circuit 122 outputs a control signal GC to the scanning signal line driver circuit 123, and also outputs clock signals $CK_1$ and $CK_2$, a start pulse ST, and analog display data ADT to the data signal line driver circuit 124. Based on the control signal GC, the scanning signal line driver circuit 123 sequentially selects the scanning signal lines $G_1$ to $G_m$ one at a time.

The data signal line driver circuit 124 includes an n-stage shift register 10 and n sampling switches 125. The n sampling switches 125 are connected at one terminal to their respective data signal lines $S_1$ to $S_n$ and are provided at the other terminal with the analog display data ADT. Then sampling switches 125 are provided at their gate terminals with output signals $SHOUT_1$ to $SROUT_n$, respectively, from the shift register 10.

The output signals $SHOUT_1$ to $SHOUT_n$ are sequentially set to high level one at a time, so that the n sampling switches 125 are sequentially brought into on-state one at a time, and the analog display data ADT is provided to data signal lines connected to the sampling switches 125 in on-state. As a result, for pixel circuits $P_{ij}$ for one row selected by the scanning signal line driver circuit 123, a voltage corresponding to the display data DT is sequentially written to one element at a time. In this manner, the liquid crystal display device 120 displays video. Note that one output signal $SROUT_i$ may be provided to gate terminals of a plurality of sampling switches 125.

In this manner, the shift register 10 can be used as a scanning signal line driver circuit of a display device or can be included and used in a data signal line driver circuit of a display device. In addition, the shift register 10 can be used in, for example, a driver circuit of an imaging device. By using the shift register 10 in a display device, an imaging device, or the like, it becomes possible to instantaneously eliminate video disturbance resulting from malfunction of a scanning signal line driver circuit or a data signal line driver circuit of a display device due to noise.

Described next is an effect of the shift register 10 according to the present embodiment. As described above, when the shift register 10 malfunctions, so that output signals provided by the previous- and subsequent-stage unit circuits 11 are simultaneously set to high level, the malfunction restoration circuits 17 and 18 included in the unit circuit 11 detect the malfunction. In this case, the malfunction restoration circuit 17 provides a high voltage to the node $N_2$, thereby forcibly pulling down the output signal OUT. Also, the malfunction restoration circuit 18 provides a low voltage to the node $N_1$, thereby forcibly discharging the node $N_1$, so that the charge accumulated in the capacitance $C_1$ is released. As a result, the shift register 10 in malfunction can be instantaneously restored to normal operation.

<1.1 First Variant>

In the first embodiment, each unit circuit 11 includes two malfunction restoration circuits 17 and 18. However, it is not always necessary to include two malfunction restoration circuits 17 and 18, and either one of them may be included. When only the malfunction restoration circuit 17 is included, the malfunction restoration circuit 17 outputs a high voltage $(VDD-V_{th})$ from the output terminal $ROUT_1$ to the node $N_2$, as described above. Accordingly, the potential of the node $N_2$ is set to $(VDD-V_{th})$. As a result, the transistor $T_3$ is brought into on-state, forcibly pulling down the output signal OUT. Also, the transistor $T_4$ is brought into on-state, so that the potential of the node $N_1$ is set to VSS, forcibly discharging the node $N_1$.

On the other hand, when only the malfunction restoration circuit 18 is included, the malfunction restoration circuit 18 outputs a low voltage from the output terminal $ROUT_2$ to the node $N_1$. Accordingly, the node $N_1$ is forcibly discharged, and VSS is provided to the gate terminal of the transistor $T_2$ bringing the transistor $T_2$ into off-state and alleviating load on the clock terminal CK. As a result, the period of time before the reset signal generation circuit 12 outputs a high-level reset signal is shortened. When the high-level reset signal is provided to the gate electrode of the transistor $T_3$, the transistor $T_3$ is brought into on-state, forcibly pulling down the output signal OUT to VSS.

In this manner, even when only one of the malfunction restoration circuits 17 and 18 is included in the unit circuit 11, the node $N_1$ can be forcibly discharged, and the output signal OUT outputted to the output terminal OUT can be forcibly pulled down. Therefore, it is possible to reduce circuit complexity of the unit circuit 11, resulting in a smaller shift register 10.

<1.2 Second Variant>

In the first embodiment, the output signal $SROUT_{(i-1)}$ from the (i−1)'th-stage unit circuit $SR_{(i-1)}$ and the output signal $SROUT_{(i+1)}$ from the (i+1)'th-stage unit circuit $SR_{(i+1)}$ are inputted to the i'th-stage unit circuit $SR_i$, but this is not restrictive, and an output signal $SROUT_{(i-q)}$ from the (i−q)'th-stage (where q is an integer from 1 to (i−1)) unit circuit $SR_{(i-q)}$ and an output signal $SROUT_{(i+r)}$ from the (i+r)'th-stage (where r is an integer from 1 to (n−i)) unit circuit $SR_{(i+r)}$ may be inputted individually. In this case, the same effect can be achieved as in the first embodiment.

2. Second Embodiment

Figure 8:
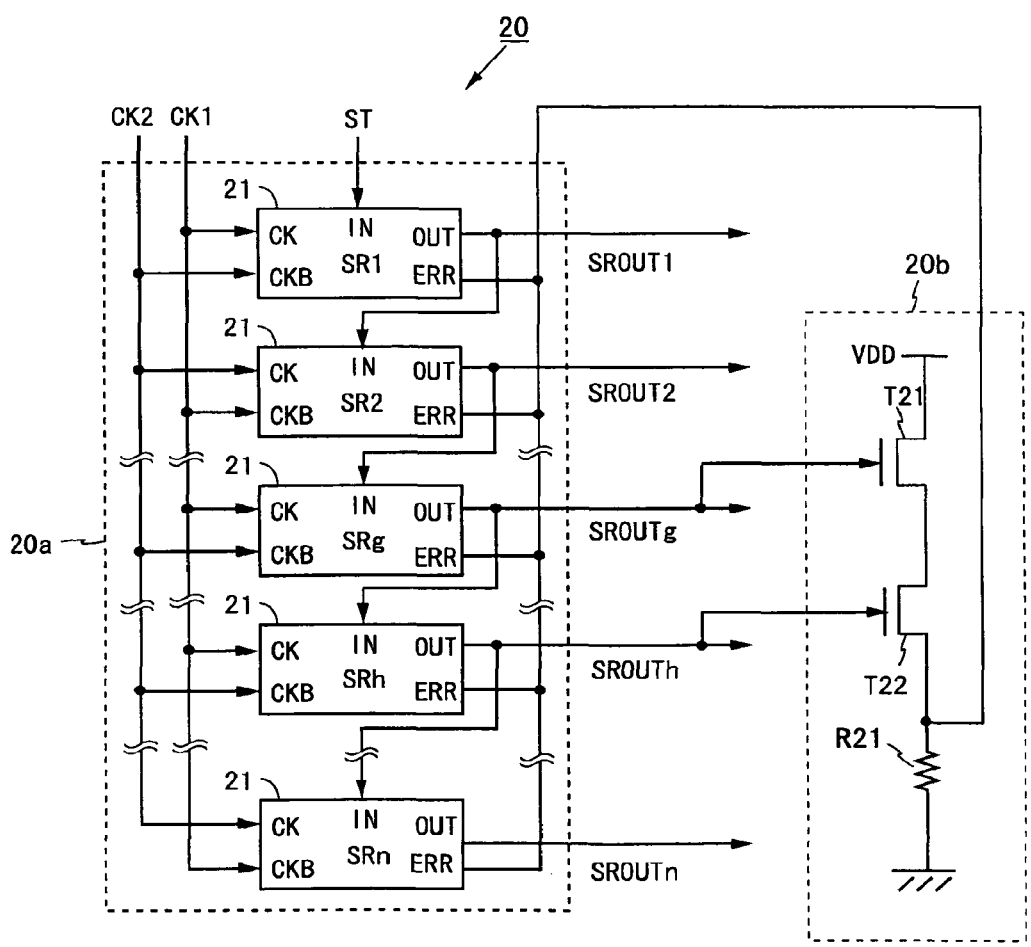
FIG. 8 is a block diagram illustrating the configuration of a shift register according to a second embodiment of the present invention.

FIG. 8 is a circuit diagram of a shift register 20 according to a second embodiment. The shift register 20 according to the second embodiment is configured in the same manner as the shift register 10, and used in the same form as the shift register 10. Therefore, the following describes differences from the first embodiment, and any descriptions about common attributes with the first embodiment are omitted.

The shift register 20 shown in FIG. 8 is provided with a base shift register 20a having n unit circuits 21 connected in multiple stages and a malfunction detection circuit 20b. The unit circuit 21 has an input terminal IN to which an output signal OUT is provided from a previous-stage unit circuit 21 and an error terminal ERR to which a detection signal DET (to be described in detail later) is provided.

The malfunction detection circuit 20b is provided independently of the base shift register 20a, and detects whether or not the base shift register 20a malfunctions based on output signals from any two of the even-numbered-stage unit circuits 21 connected to the same clock signal line or from any two of the odd-numbered-stage unit circuits 21 connected to the same clock signal line. Then, when the malfunction detection circuit 20b detects malfunction of the base shift register 20a, a high-level detection signal DET is provided to error terminals ERR of all unit circuits 21.

The malfunction detection circuit 20b includes two N-channel transistors $T_{21}$ and $T_{22}$ and a resistive element $R_{21}$, and the transistor $T_{21}$ has a power-supply voltage VDD provided to a drain terminal and is connected at a source terminal to a drain terminal of the transistor $T_{22}$. The transistor $T_{22}$ is grounded at a source terminal via the resistive element $R_{21}$. Also, the connection point between the source terminal of the transistor $T_{22}$ and the resistive element $R_{21}$ is connected to the error terminal ERR of each of the unit circuits $SR_1$ to $SR_n$.

The transistors $T_{21}$ and $T_{22}$ are connected at their gate terminals to any two of the even-numbered-stage unit circuits 21 connected to the same clock signal line. In the following descriptions, the transistors $T_{21}$ and $T_{22}$ are connected at their gate terminals to output terminals $OUT_g$ and $OUT_h$ of the g'th- and h'th-stage (where g is an even number from 2 to n and h is another even number from 2 to n) unit circuits $SR_g$ and $SR_h$, i.e., the two of the even-numbered-stage unit circuits 21.

When high-level (VDD) output signals $SROUT_g$ and $SROUT_h$ are respectively provided to the gate terminals of the transistors $T_{21}$ and $T_{22}$, the transistors $T_{21}$ and $T_{22}$ are both brought into on-state. Accordingly, the potential at the connection point between the source terminal of the transistor $T_{22}$ and the resistive element $R_{21}$ is set to $(VDD-V_{th})$ (where $V_{th}$ is a threshold voltage of each of the transistors $T_{21}$ and $T_{22}$) so that a high-level $(VDD-V_{th})$ detection signal DET is provided to the error terminal ERR of each of the unit circuits $SR_1$ to $SR_n$. On the other hand, when at least one of the output signals $SROUT_g$ and $SROUT_h$ respectively provided to the gate terminals of the transistors $T_{21}$ and $T_{22}$ is at low level, the transistor provided with the low-level output signal is brought into off-state. Accordingly, the potential at the connection point between the source terminal of the transistor $T_{22}$ and the resistive element $R_{21}$ is set to VSS, and the low-level detection signal DET is provided to the error terminal ERR of each of the unit circuits $SR_1$ to $SR_n$.

Figure 9:
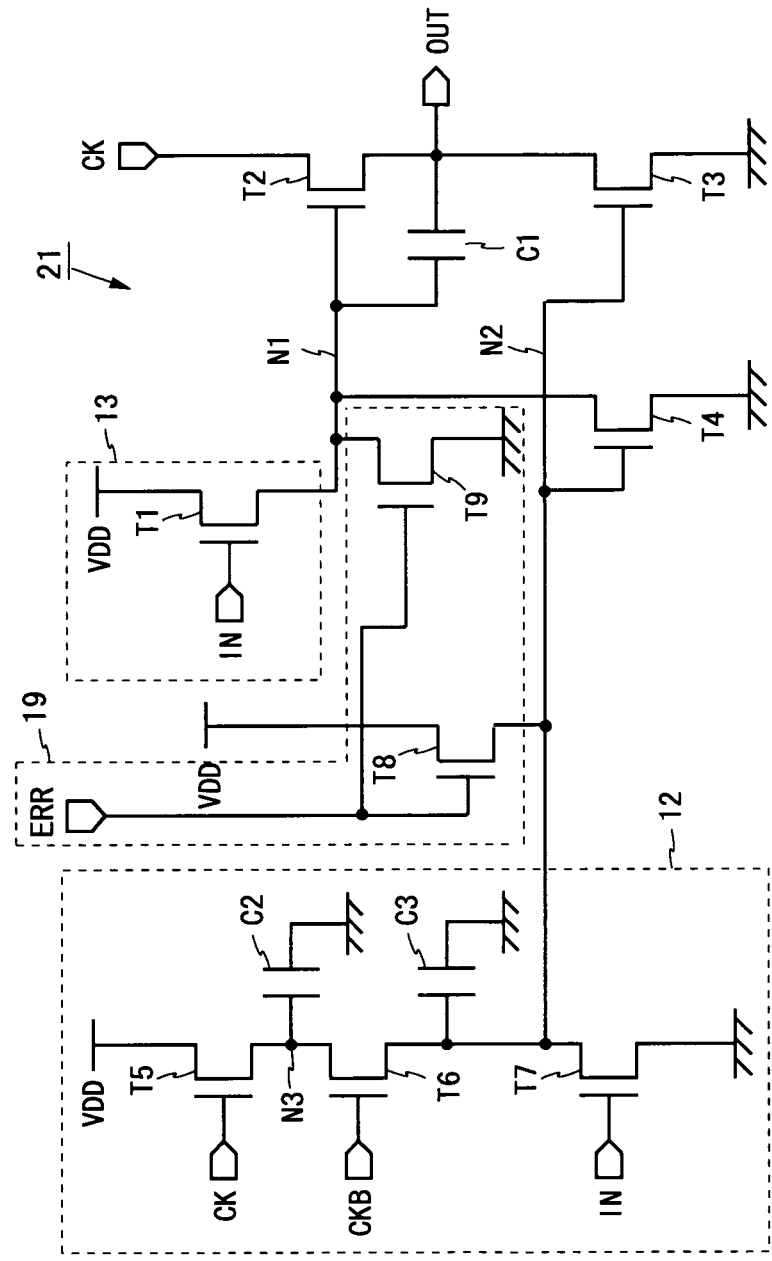
FIG. 9 is a circuit diagram of a unit circuit included in the shift register shown in FIG. 8.

FIG. 9 is a circuit diagram of the unit circuit 21 included in the base shift register 20a. The unit circuit 21 shown in FIG. 9 has the same elements as the unit circuit 11, except that a restoration execution circuit 19 connected to the error terminal ERR is provided in place of the malfunction restoration circuits 17 and 18 provided in the unit circuit 11 of the first embodiment.

The restoration execution circuit 19 includes two N-channel transistors $T_8$ and $T_9$, and the transistor $T_8$ has a power-supply voltage VDD provided to a drain terminal and is connected at a source terminal to the node $N_2$. The transistor $T_9$ is connected at a drain terminal to the node $N_1$ and is grounded at a source terminal. Also, the transistors $T_8$ and $T_9$ are connected at their gate terminals to the error terminal ERR.

While the unit circuit 11 of the first embodiment in normal operation has low-level input signals $IN_p$ and $IN_n$ provided to the input terminals $IN_p$ and $IN_n$, respectively, the unit circuit 21 differs from the unit circuit 11 in that a detection signal DET is provided to the error terminal ERR. However, they are substantially the same, and therefore, during normal operation, the base shift register 20a operates in the same manner as the shift register 10. Therefore, any descriptions about the base shift register 20a in normal operation will be omitted.

Described next is a case where the base shift register 20a in malfunction due to noise is restored to normal operation. FIG. 10 is a timing chart where the base shift register 20a is restored to normal operation after malfunction of the base shift register 20a during normal operation.

When the base shift register 20a is in normal operation, a low-level detection signal DET from the malfunction detection circuit 20b is provided to each unit circuit 21. When the low-level detection signal DET is provided to the gate terminals of the transistors $T_8$ and $T_9$ included in the restoration execution circuit 19, both the transistors $T_8$ and $T_9$ maintain off-state, and therefore VDD and VSS cannot pass therethrough. That is, during the normal operation period, the source terminal of the transistor $T_8$ and the drain terminal of the transistor $T_9$ are set in high-impedance state.

When the base shift register 20a malfunctions, a high-level $(VDD-V_{th})$ detection signal DET is provided to the error terminal ERR, and therefore both the transistors $T_8$ and $T_9$ are brought into on-state. Accordingly, the source terminal of the transistor $T_8$ outputs $(VDD-2V_{th})$ (where $V_{th}$ is a threshold voltage of the transistor $T_8$), while the source terminal of the transistor $T_9$ outputs VSS. As a result, the potential of the node $N_2$ is set to $(VDD-2V_{th})$, bringing the transistor $T_3$ into on-state, so that the output signal OUT is forcibly pulled down. Also, the potential of the node $N_1$ is forcibly discharged to reach VSS, so that the charge accumulated in the capacitance $C_1$ is also released. As a result, both the output signal OUT and the detection signal DET are set to low level, so that the base shift register 20a can be instantaneously restored from malfunction.

Next, an effect of the shift register 20 according to the present embodiment will be described. As described above, when output signals $SROUT_g$ and $SROUT_h$ from the output terminals OUT of two arbitrary unit circuits $SR_g$ and $SR_h$ connected to the same clock signal line, which are chosen from among the even-numbered-stage unit circuits, are both set to high level, the malfunction detection circuit 20b provides a high-level detection signal DET to the error terminal ERR of each unit circuit 21. As a result, the unit circuit 21 forcibly pulls down the output signal OUT to VSS, and discharges the node $N_1$, thereby releasing the charge accumulated in the capacitance $C_1$. Thus, even when the base shift register 20a malfunctions, the base shift register 20a can be instantaneously restored to normal operation by turning on a plurality of unit circuits 21 connected to the same clock signal line.

Note that when a plurality of even-numbered-stage unit circuits 21 connected to the same clock signal line output high-level output signals OUT, all the unit circuits 21 that output the high-level output signals OUT are connected at their clock terminals CK to the exterior via the output terminals OUT, resulting in increased load on the clock signal line, which makes it difficult to cause the unit circuit 21 to be restored from malfunction. Accordingly, it is often the case that all even-numbered-stage unit circuits 21 connected to the same clock signal line output simultaneously output high-level output signals OUT. Therefore, by using the shift register 20, it becomes possible to detect malfunction with high probability by selecting any two of the even-numbered-stage unit circuits 21 connected to the same clock signal line. However, when any of the selected unit circuits 21 do not malfunction, the shift register 20 might not be able to detect malfunction of any other unit circuit 21 that is not selected. Also, to detect whether or not there is malfunction, any three or more, rather than two, unit circuits 21 may be connected at their output terminals OUT to the malfunction detection circuit 20b.

<2.1 First Variant>

In the second embodiment, the unit circuit 21 is provided with two transistors $T_8$ and $T_9$ included in the restoration execution circuit 19. However, it is not necessary to provide the two transistors $T_8$ and $T_9$ in the restoration execution circuit 19, and either one of them may be provided. When only the transistor $T_8$ is provided, the output signal OUT is forcibly pulled down, and the node $N_1$ is forcibly discharged, as in the case where the malfunction restoration circuit 17 is provided in the first variant of the first embodiment.

On the other hand, when only the transistor $T_9$ is provided, the node $N_1$ is forcibly discharged and the reset signal generation circuit 12 outputs a high-level reset signal, thereby forcibly pulling down the output signal OUT, as in the case where the malfunction restoration circuit 18 is provided in the first variant of the first embodiment.

In this manner, even when only one of the transistors $T_8$ and $T_9$ is provided in the restoration execution circuit 19, it is possible to forcibly discharge the node $N_1$ and forcibly pull down the output signal OUT. Thus, it is possible to reduce circuit complexity of the unit circuit 21, resulting in a smaller shift register 20.

<2.2 Second Variant>

In the second embodiment, any two of the even-numbered-stage unit circuits 21 connected to the same clock signal line provide output signals to the malfunction detection circuit 20b. However, any two of the odd-numbered-stage unit circuits 21 connected to the same clock signal line may be connected at their output terminals to the gate terminals of the transistors $T_{21}$ and $T_{22}$ in the malfunction detection circuit 20b. In this case, the same effect can be achieved as in the second embodiment. Also, to detect whether or not there is malfunction, any three or more, rather than two, unit circuits 21 may be connected at their output terminals to the malfunction detection circuit 20b.

Note that when even-numbered-stage unit circuits 21 are used, the shift register 20 can be readily designed by using output signals from the second-stage and the highest even-numbered unit circuits 21, and when odd-numbered-stage unit circuits 21 are used, the shift register 20 can be readily designed by using output signals from the first-stage and the highest odd-numbered unit circuits 21.

Described next are third to sixth variants of the malfunction detection circuit 20b used in the shift register 20. Note that in any variant, the base shift register and the unit circuit are the same as the base shift register 20a and the unit circuit 21 in the second embodiment, and therefore any descriptions thereof will be omitted.

<2.3 Third Variant>

FIG. 11(A) is a circuit diagram of a malfunction detection circuit 22b according to the third variant. In the malfunction detection circuit 22b shown in FIG. 11(A), a power-supply voltage VDD is provided to a drain terminal of a transistor $T_{31}$ via a resistive element $R_{31}$. The transistor $T_{31}$ is connected at a source terminal to a drain terminal of a transistor $T_{32}$, and the transistor $T_{32}$ is grounded at a source terminal. Also, a transistor $T_{33}$ has a power-supply voltage VDD provided to a drain terminal and is connected at a source terminal to a drain terminal of a transistor $T_{34}$. The transistor $T_{34}$ is connected at a source terminal to a drain terminal of a transistor $T_{35}$, and the transistor $T_{35}$ is grounded at a drain terminal. The transistor $T_{35}$ is connected at a gate terminal to the connection point between the drain terminal of the transistor $T_{31}$ and the resistive element $R_{31}$.

The transistors $T_{31}$ and $T_{33}$ are connected at their gate terminals to an output terminal $OUT_g$ of a unit circuit $SR_g$, and the transistors $T_{32}$ and $T_{34}$ are connected at their gate terminals to an output terminal $OUT_h$ of a unit circuit $SR_h$. The connection point between the source terminal of the transistor $T_{34}$ and the drain terminal of the transistor $T_{35}$ is connected to the error terminal ERR of each unit circuit 21.

When the base shift register 20a malfunctions, the unit circuit $SR_g$ provides a high-level (VDD) output signal $SROUT_{g2}$ to the gate terminals of the transistors $T_{31}$ and $T_{33}$, and the unit circuit $SR_h$ provides a high-level (VDD) output signal $SROUT_h$ to the gate terminals of the transistors $T_{32}$ and $T_{34}$, bringing the transistors $T_{31}$ to $T_{34}$ all into on-state. At this time, the potential at the connection point between the drain terminal of the transistor $T_{31}$ and the resistive element $R_{31}$ is set to VSS, so that an off-voltage is provided to the gate terminal of the transistor $T_{35}$, bringing the transistor $T_{35}$ into off-state. As a result, the potential at the connection point between the source terminal of the transistor $T_{34}$ and the drain terminal of the transistor $T_{35}$ is set to (VDD–$V_{th}$) (where $V_{th}$ is a threshold voltage of each of the transistors $T_{33}$ and $T_{34}$), and the malfunction detection circuit 22b provides a high-level (VDD–$V_{th}$) detection signal DET to the error terminal ERR of each unit circuit 21. Also, in the malfunction detection circuit 22b, when the unit circuits $SR_g$ and $SR_h$ malfunction, VSS is always provided to the gate terminal of the transistor $T_{35}$, thereby ensuring output of the high-level detection signal DET.

<2.4 Fourth Variant>

FIG. 11(B) is a circuit diagram of a malfunction detection circuit 23b according to the fourth variant. The malfunction detection circuit 23b shown in FIG. 11(B) is a circuit consisting of a combination of a malfunction detection portion 23c and an initialization portion 23d. Since the malfunction detection portion 23c is configured in the same manner as the malfunction detection circuit 20b in the second embodiment, the same elements as those of the malfunction detection circuit 20b are denoted by the same reference characters, and any descriptions thereof will be omitted.

The initialization portion 23d includes an N-channel transistor $T_{41}$, which has a power-supply voltage VDD provided to a drain terminal and is connected at a source terminal to the connection point between the source terminal of the transistor $T_{22}$ and the resistive element $R_{21}$.

When the base shift register 20a malfunctions, the malfunction detection portion 23c provides a high-level (VDD–$V_{th}$) (where $V_{th}$ is a threshold voltage of each of the transistors $T_{21}$ and $T_{22}$) detection signal DET to each unit circuit 21, as described above.

Also, when a high-level (VDD) initialization signal INIT is externally provided to the gate terminal of the transistor $T_{41}$, the transistor $T_{41}$ is brought into on-state, so that the potential at the connection point between the source terminal of the transistor $T_{41}$ and the resistive element $R_{21}$ is set to (VDD–$V_{th}$) (where $V_{th}$ is a threshold voltage of the transistor $T_{41}$). As a result, the high-level (VDD–$V_{th}$) initialization signal INIT is provided to the error terminal ERR of each unit circuit 21, initializing the unit circuit 21.

In this manner, the malfunction detection circuit 23b provides both the detection signal DET from the malfunction detection portion 23c and the initialization signal INIT from the initialization portion 23d to the error terminal ERR of each unit circuit 21. As a result, the detection signal DET is provided to the restoration execution circuit 19 in the unit circuit 21, instantaneously restoring the unit circuit 21 from malfunction, and the initialization signal INIT is also provided to the restoration execution circuit 19, initializing the unit circuit 21. In addition, the restoration execution circuit 19 is used not only to restore the unit circuits 21 from malfunction but also to initialize them. Therefore, when compared to the case where the initialization circuit is included in the unit circuit 21, it is possible to minimize increase in circuit complexity of the unit circuit 21.

<2.5 Fifth Variant>

FIG. 12(A) is a circuit diagram of a malfunction detection circuit 24b according to the fifth variant. The malfunction detection circuit 24b shown in FIG. 12(A) is a circuit consisting of a combination of a malfunction detection portion 24c and an initialization portion 24d. Since the malfunction detection portion 24c is configured in the same manner as the malfunction detection circuit 22b in the third variant, and the initialization portion 24d is configured in the same manner as the initialization portion 23d in the fourth variant, the same elements as in those variants are denoted by the same reference characters, and any descriptions thereof will be omitted.

When the base shift register 20a malfunctions, the unit circuits $SR_g$ and $SR_h$ respectively provide high-level (VDD) output signals $SROUT_g$ and $SROUT_h$ to the gate terminals of the transistors $T_{31}$ to $T_{34}$ in the malfunction detection portion 24c, as described above. As a result, as in the case of the malfunction detection circuit 22b, the malfunction detection portion 24c provides a high-level (VDD–$V_{th}$) (where $V_{th}$ is a threshold voltage of each of the transistors $T_{33}$ and $T_{34}$) detection signal DET to each unit circuit 21, as described above.

Also, when a high-level (VDD) initialization signal INIT is externally provided to the gate terminal of the transistor $T_{41}$ of the initialization portion 24d, the initialization portion 24d provides a high-level (VDD–$V_{th}$) (where $V_{th}$ is a threshold voltage of the transistor $T_{41}$) initialization signal INIT to the error terminal ERR of each unit circuit 21, as described above.

Accordingly, the malfunction detection circuit 24b can achieve the same effect as the malfunction detection circuit 23b in the fourth variant. Also, since the malfunction detection portion 24c of the malfunction detection circuit 24b is configured in the same manner as the malfunction detection circuit 22b in the third variant, the malfunction detection circuit 24b can reliably output the high-level detection signal DET.

<2.6 Sixth Variant>

FIG. 12(B) is a circuit diagram of a malfunction detection circuit 25b according to the sixth variant. The malfunction detection circuit 25b shown in FIG. 12(B) is a circuit consisting of a combination of a malfunction detection portion 25c and an initialization portion 25d. The malfunction detection portion 25c includes two N-channel transistors $T_{51}$ and $T_{52}$, and the transistor $T_{51}$ has a power-supply voltage VDD provided to a drain terminal and is connected at a source terminal to a drain terminal of the transistor $T_{52}$. The transistor $T_{52}$ is connected at a source terminal to one terminal of a resistive element $R_{52}$ and also to the error terminal ERR of each unit circuit 21. Also, the transistors $T_{51}$ and $T_{52}$ are connected at their gate terminals respectively to the output terminals $OUT_g$ and $OUT_h$ of the unit circuits $SR_g$ and $SR_h$.

The initialization portion 25d includes an N-channel transistor $T_{53}$ and a resistive element $R_{51}$, and the transistor $T_{53}$ is grounded at a source terminal and has a power-supply voltage VDD provided to a drain terminal via the resistive element $R_{51}$. Also, an initialization signal INITB (negation to INIT) is provided to a gate terminal. The connection point between the resistive element $R_{51}$ and the drain terminal of the transistor $T_{53}$ is connected to the other terminal of the resistive element $R_{52}$.

When the shift register 20 malfunctions and the output signals $SROUT_g$ and $SROUT_h$ respectively provided to the gate terminals of the transistors $T_{51}$ and $T_{52}$ of the malfunction detection portion 25c by the unit circuits $SR_g$ and $SR_h$ are both at high level (VDD), the transistors $T_{51}$ and $T_{52}$ are both brought into on-state. Therefore, the potential at the connection point between the transistor $T_{52}$ and the resistive element $R_{52}$ is set to (VDD–$V_{th}$) (where $V_{th}$ is a threshold voltage of each of the transistors $T_{51}$ and $T_{52}$), and the malfunction detection portion 25c provides a high-level detection signal DET to the error terminal ERR of each unit circuit 21.

Also, when a low-level initialization signal INITB is provided to the gate terminal of the transistor $T_{53}$, the transistor $T_{53}$ is brought into off-state, so that the potential at the connection point between the drain terminal of the transistor $T_{53}$ and the resistive element $R_{52}$ is set to VDD. Accordingly, the initialization portion 25d provides a high-level (VDD) detection signal DET to the error terminal ERR of each unit circuit 21. In this case also, it is possible to achieve the same effect as that achieved by the malfunction detection circuit 23b in the fourth variant.

3. Third Embodiment

Figure 13:
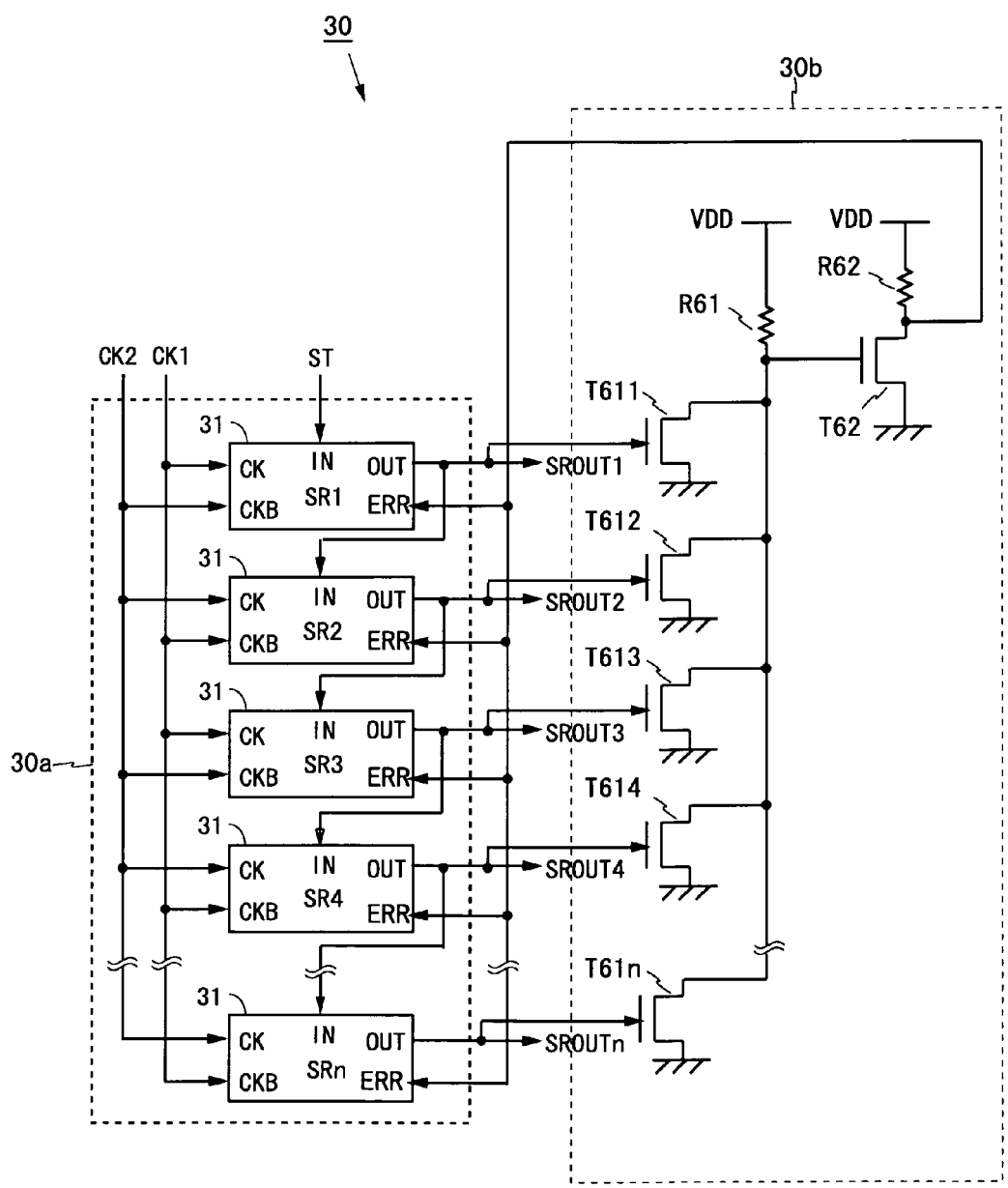
FIG. 13 is a block diagram illustrating the configuration of a shift register according to a third embodiment of the present invention.

FIG. 13 is a circuit diagram of a shift register 30 according to a third embodiment of the present invention. The shift register 30 is provided with a base shift register 30a having unit circuits 31 connected in multiple stages and a malfunction detection circuit 30b for detecting whether or not the base shift register 30a malfunctions based on an output signal outputted from the base shift register 30a. The base shift register 30a is a circuitry consisting of the unit circuits 31 connected in multiple stages, as in the second embodiment, and also the unit circuit 31 is the same as the unit circuit 21 used in the second embodiment. Therefore, any descriptions thereof will be omitted.

The malfunction detection circuit 30b will be described. The malfunction detection circuit 30b is provided with n N-channel transistors $T_{611}$ to $T_{61n}$ corresponding to n unit circuits $SR_1$ to $SR_n$. The transistors $T_{611}$ to $T_{61n}$ are grounded at their source terminals and are connected at their drain terminals to one terminal of a resistive element $R_{61}$ such that the transistors $T_{611}$ to $T_{61n}$ are connected in parallel. The resistive element $R_{61}$ has a power-supply voltage VDD provided to the other terminal. Also, the transistor $T_{62}$ has a power-supply voltage VDD provided to a drain terminal via a resistive element $R_{62}$ and is grounded at a source terminal.

The transistor $T_{62}$ is connected at a gate terminal to the connection points between the resistive element $R_{61}$ and the drain terminals of the transistors $T_{611}$ to $T_{61n}$, and the connection point between the resistive element $R_{62}$ and the drain terminal of the transistor $T_{62}$ is connected to the error terminal ERR of each unit circuit 31. Note that the resistance value of the resistive element $R_{61}$ is pre-adjusted such that when one of the transistors $T_{611}$ to $T_{61n}$ is in on-state, i.e., transistor on-resistance corresponds to one transistor, the transistor $T_{62}$ is in off-state, and when two or more transistors are in on-state, i.e., transistor on-resistance corresponds to two or more transistors, the transistor $T_{62}$ is in on-state. In this manner, the transistor $T_{62}$ has a function of a detection transistor for detecting malfunction of the unit circuits 31.

Described next is the operation of the malfunction detection circuit 30b. First, a case where the shift register 30 is in normal operation is described. In this case, any one unit circuit $SR_x$ (where x is an integer from one to n) always outputs a high-level output signal $SROUT_x$ to be provided to the gate terminal of a transistor $T_{61x}$ corresponding to that output signal $SROUT_x$. As a result, only the transistor $T_{61x}$ is brought into on-state.

In this case, in the malfunction detection circuit 30b, the resistive element $R_{61}$ and the on-resistance of the transistor $T_{61x}$ are connected in series, providing the potential at the connection point between the resistive element $R_{61}$ and the drain terminal of the transistor $T_{61x}$ to the gate terminal of the transistor $T_{62}$. The resistance value of the resistive element $R_{61}$ is pre-adjusted as described above, such that the transistor $T_{62}$ is brought into on-state only when one of the transistors $T_{611}$ to $T_{61n}$ is in on-state. Therefore, when only the transistor $T_{61x}$ is in on-state, the transistor $T_{62}$ is brought into on-state, so that the potential at the connection point between the drain terminal of the transistor $T_{62}$ and the resistive element $R_{62}$ is set to VSS. Accordingly, a low-level detection signal DET is provided to the error terminal ERR of each unit circuit 31.

Described next is a case where output signals $SROUT_x$ and $SROUT_y$, which are provided by two unit circuits 31, namely, $SR_x$ and $SR_y$ (where y is an integer from 1 to n), to their respective gate terminals of corresponding transistors $T_{61x}$ and $T_{61y}$, are simultaneously set to high level when the base shift register 30a malfunctions. In this case, only the two transistors $T_{61x}$ and $T_{61y}$ having the high-level output signals $SROUT_x$ and $SROUT_y$ provided to their respective gate terminals are brought into on-state. As a result, a resistance consisting of parallel-connected on-resistances of the two transistors $T_{61x}$ and $T_{61y}$ is connected in series with the resistive element $R_{61}$. In this case, the resistance value of each on-resistance is small compared to the case where the on-resistance of the single transistor $T_{61x}$ is connected in series with the resistive element $R_{61}$. Accordingly, the potential at the connection point between the resistive element $R_{61}$ and the drain terminal of each of the transistors $T_{61x}$ and $T_{61y}$, is smaller than that of the single transistor $T_{61x}$ in on-state.

On the other hand, the resistance value of the resistive element $R_{62}$ is adjusted as described above, such that the transistor $T_{62}$ is brought into off-state when the two transistors $T_{61x}$ and $T_{61y}$ are brought into on-state. Therefore, the transistor $T_{62}$ is brought into off-state, so that the potential at the connection point between the resistive element $R_{62}$ and the transistor $T_{62}$ is set to VDD. As a result, a high-level (VDD) detection signal DET is provided to the error terminal ERR of each unit circuit 31.

Similarly, when output signals from three or more unit circuits 31 are simultaneously set to high level, on-resistances for transistors in on-state are connected in parallel, and therefore the resistance value is further reduced. As a result, the transistor $T_{62}$ is brought into off-state, and the potential at the connection point between the resistive element $R_{62}$ and the transistor $T_{62}$ is set to VDD. Accordingly, a high-level (VDD) detection signal DET is provided to the error terminals ERR of the unit circuits 31.

Note that the unit circuit 31 is the same as the unit circuit 21 in the second embodiment shown in FIG. 8. Accordingly, when a high level detection signal DET is provided to the error terminal ERR of the unit circuit 31, the unit circuit 31 is instantaneously restored from malfunction to normal operation by forcibly pulling down the output signal and discharging the node $N_1$, thereby releasing the charge accumulated in the capacitance $C_1$, as has already been described.

An effect of the shift register 30 according to the present embodiment will be described. Where all unit circuits 31 provide output signals $SROUT_1$ to $SROUT_n$ from their output terminals and at least two or more unit circuits 31 simultaneously output high-level output signals, any of the transistors $T_{611}$ to $T_{61n}$ that have the high-level output signals provided to their gate terminals are brought into on-state. Therefore, the potential at the connection point between the resistor $R_{61}$ and the drain terminal of each of the transistors $T_{611}$ to $T_{61n}$ is reduced. As a result, the transistor $T_{62}$ is brought into off-state, and a high-level detection signal DET is provided to the error terminal ERR of each unit circuit 31, so that the unit circuit 31 can be instantaneously restored to normal operation. Note that by adjusting the resistance value of the resistor $R_{61}$, it becomes possible to change the number of on-state transistors required for outputting the high-level detection signal DET. The above is also applicable to the case where the malfunction detection circuit 30b is formed using P-channel transistors, but in such a case, the potential at the connection point between the resistor $R_{61}$ and the drain terminal of each of the transistors $T_{611}$ to $T_{61n}$ is increased.

4. Others

Figure 14:
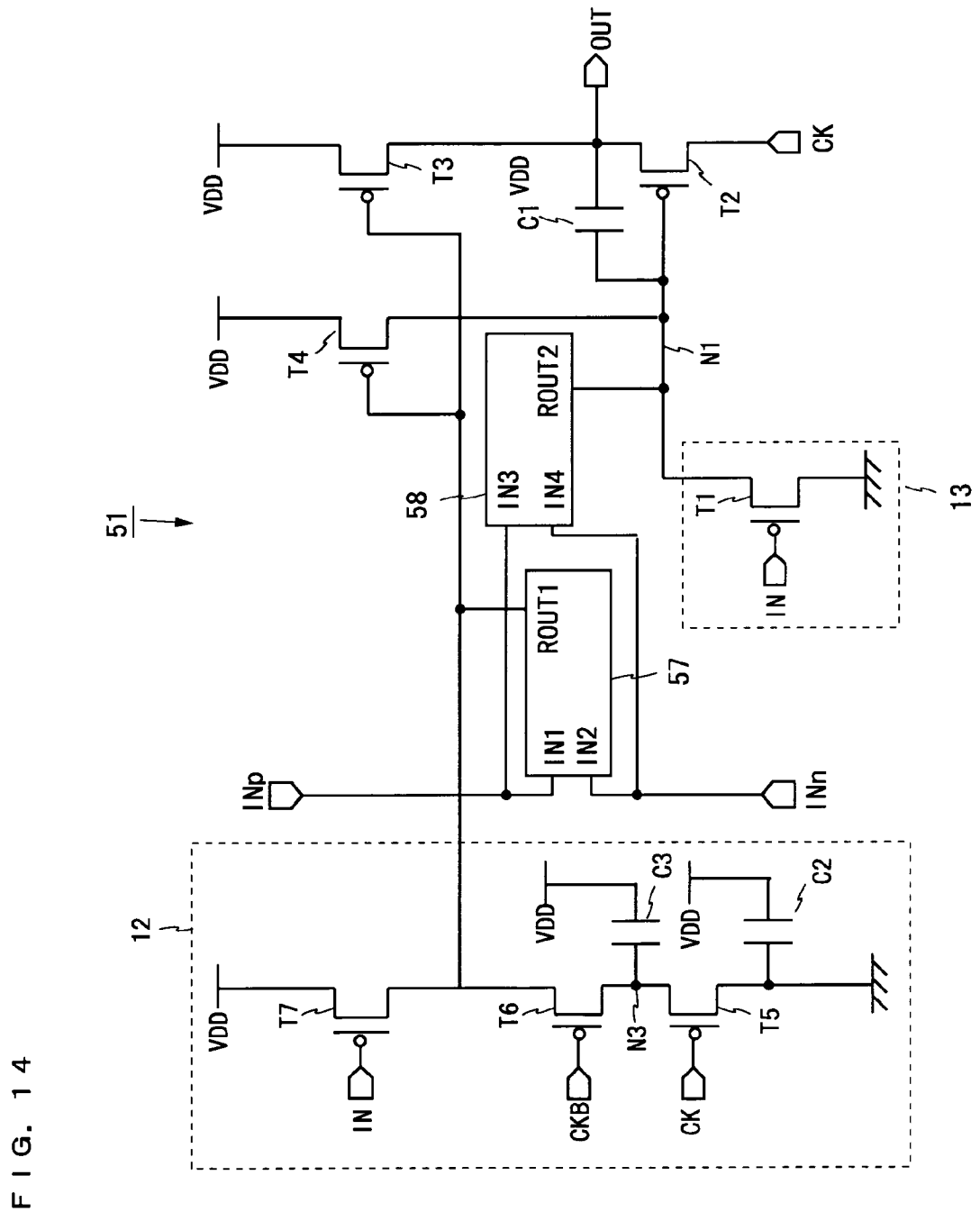
FIG. 14 is a circuit diagram of another variant of the unit circuit included in the shift register according to the first embodiment of the present invention.
Figure 16:
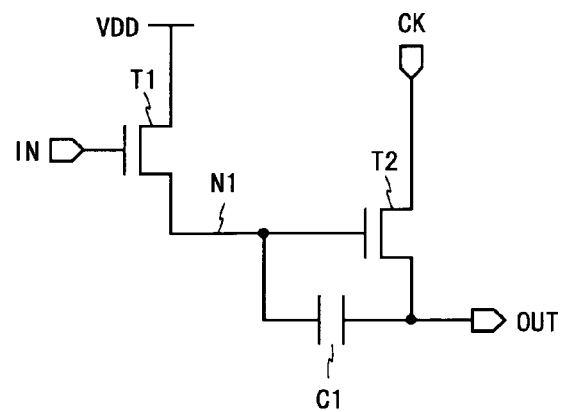
FIG. 16 is a circuit diagram of a bootstrap circuit included in the shift register.
Figure 17:
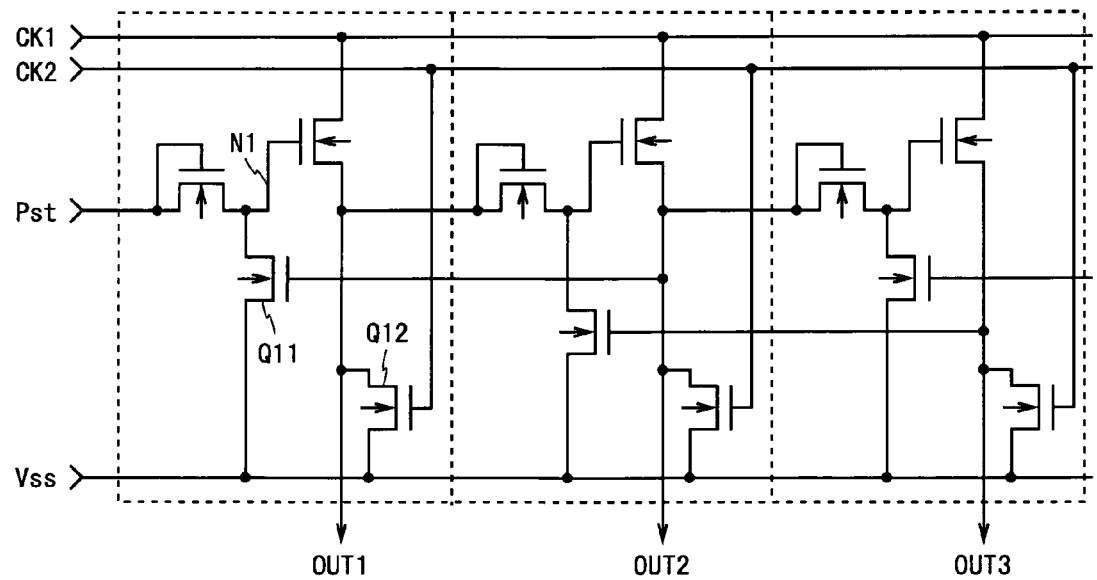
FIG. 17 is a circuit diagram illustrating the configuration of a conventional shift register.

While the circuits included in the first to third embodiments and their variants are configured using N-channel transistors, they may be configured using P-channel transistors. As an example, FIG. 14 illustrates a unit circuit 51 configured by P-channel transistors. Also, in FIG. 15, malfunction restoration circuits 57 and 58 included in the unit circuit 51 are configured by P-channel transistors. The configurations and operations of the unit circuit 51 and the malfunction restoration circuits 57 and 58 are the same as those of the unit circuit 11 and the malfunction restoration circuits 17 and 18, respectively, and therefore any descriptions thereof will be omitted herein.

Also, the first to third embodiments and their variants have been described regarding shift registers operating based on two-phase clock signals. However, the shift registers operating based on two-phase clock signals are not restrictive, and the shift registers can operate based on multiple-phase clock signals in a similar manner to the case of the two-phase clock signals, and can achieve similar effects.

INDUSTRIAL APPLICABILITY

The present invention is applicable to shift registers in which, when a plurality of unit circuits connected in multiple stages malfunction so as to be simultaneously turned on and provide high-level output signals, all the unit circuits are instantaneously restored to normal operation, and the invention is particularly suitable for driver circuits or suchlike of display devices and imaging devices.

The invention claimed is:

1. A shift register having a plurality of unit circuits connected in multiple stages and operating based on multiple-phase clock signals, the unit circuits being configured by transistors of the same conductivity type, the shift register comprising:
a detection circuit for outputting an active detection signal upon detection of the unit circuits being activated; and
a restoration execution circuit for deactivating the unit circuits based on the active detection signal,
wherein the unit circuits each include,
an output control transistor having one of the multiple-phase clock signals provided to a first conductive terminal and connected at a second conductive terminal to an output terminal;
a pre-charge circuit for providing an on-voltage to a control terminal of the output control transistor while an input signal is at on-level;
a discharge circuit for providing an off-voltage to the control terminal of the output control transistor; and
an output reset transistor having an off-voltage provided to a first conductive terminal and connected at a second conductive terminal to the output terminal, and
the restoration execution circuit activates the discharge circuit, thereby providing an off-voltage to the control terminal of the output control transistor, wherein,
the unit circuits each include the restoration execution circuit, and
the detection circuit provides the active detection signal to the unit circuits upon detection of all output signals from two or more unit circuits being activated, the two or more unit circuits being arbitrarily selected from either even- or odd-numbered-stage unit circuits connected to the same clock signal line.

2. The shift register according to claim 1, wherein,
the detection circuit further includes an initialization circuit to be activated upon reception of an external initialization signal, and
the restoration execution circuit activates the discharge circuit upon activation of the initialization circuit.

3. The shift register according to claim 2, wherein the restoration execution circuit provides an on-voltage to the control terminal of the output reset transistor upon activation of the initialization circuit.

4. A shift register having a plurality of unit circuits connected in multiple stages and operating based on multiple-phase clock signals, the unit circuits being configured by transistors of the same conductivity type, the shift register comprising:

a detection circuit for outputting an active detection signal upon detection of the unit circuits being activated; and a restoration execution circuit for deactivating the unit circuits based on the active detection signal, wherein the unit circuits each include, an output control transistor having one of the multiple-phase clock signals provided to a first conductive terminal and connected at a second conductive terminal to an output terminal;

a pre-charge circuit for providing an on-voltage to a control terminal of the output control transistor while an input signal is at on-level;

a discharge circuit for providing an off-voltage to the control terminal of the output control transistor; and an output reset transistor having an off-voltage provided to a first conductive terminal and connected at a second conductive terminal to the output terminal, and the restoration execution circuit activates the discharge circuit, thereby providing an off-voltage to the control terminal of the output control transistor, wherein, the unit circuits each include the restoration execution circuit, and the detection circuit detects the number of activated unit circuits based on outputs from all the unit circuits, and outputs the active detection signal corresponding to the number.

5. The shift register according to claim 4, wherein, the detection circuit includes:

a number detection circuit for outputting a number detection signal corresponding to the number of activated unit circuits among the plurality of unit circuits, and a signal output circuit for outputting the active detection signal to the restoration execution circuit when the number detection signal from the number detection circuit exceeds a predetermined range, the number detection circuit includes:

a resistive element, and a plurality of parallel-connected transistors connected at their gate terminals to their respective output terminals of the unit circuits, the transistors being connected at their first conductive terminals to one terminal of the resistive element, and a potential at a connection point between the resistive element and the first conductive terminal of each of the transistors is outputted to the signal output circuit.

6. A shift register having a plurality of unit circuits connected in multiple stages and operating based on multiple-phase clock signals, the unit circuits being configured by transistors of the same conductivity type, the shift register comprising:

a malfunction restoration circuit for restoring the shift register to normal operation upon malfunction, wherein, the unit circuits each include, an output control transistor having one of the multiple-phase clock signals provided to a first conductive terminal and connected at a second conductive terminal to an output terminal;

a pre-charge circuit for providing an on-voltage to a control terminal of the output control transistor while an input signal is at on-level;

a discharge circuit for providing an off-voltage to the control terminal of the output control transistor; and an output reset transistor having an off-voltage provided to a first conductive terminal and connected at a second conductive terminal to the output terminal, and the malfunction restoration circuit includes, a detection circuit for outputting an active detection signal upon detection of the unit circuits being activated; and a restoration execution circuit for deactivating the unit circuits based on the active detection signal, the shift register further comprising a reset signal generation circuit for generating a reset signal which is normally at on-level and changes to off-level when the input signal is set to on-level, wherein, the reset signal generation circuit includes, a first transistor having one of the multiple-phase clock signals provided to a control terminal, the provided signal being the same as that provided to the first conductive terminal of the output control transistor;

a second transistor having one of the multiple-phase clock signals provided to a control terminal, the provided signal differing from that provided to the first conductive terminal of the output control transistor, the second transistor being connected at a first conductive terminal to a second conductive terminal of the first transistor; and a third transistor having the input signal provided to a control terminal, connected at a first conductive terminal to a second conductive terminal of the second transistor, and having an off-voltage provided to a second conductive terminal, and a connection point between the second and third transistors is connected to a control terminal of the output reset transistor.

* * * * *